United States Patent
Kawaguchi et al.

(10) Patent No.: US 6,345,728 B1
(45) Date of Patent: Feb. 12, 2002

(54) COMPONENT FEEDING METHOD AND APPARATUS

(75) Inventors: Satoshi Kawaguchi, Yamanashi-ken; Akira Kabeshita, Osaka-fu; Masato Tanino, Yamanashi-ken; Takao Kashiwazaki, Yamanashi-ken; Shuichi Kubota, Yamanashi-ken; Koji Okawa, Yamanashi-ken; Tadashi Endo, Yamanashi-ken, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/559,279

(22) Filed: Apr. 27, 2000

(30) Foreign Application Priority Data

Apr. 28, 1999 (JP) ............................................. 11-122100

(51) Int. Cl.$^7$ ................................................. B23Q 7/00
(52) U.S. Cl. ........................ 221/239; 221/251; 221/290; 221/294
(58) Field of Search .................................. 221/236, 239, 221/251, 290, 294, 211

(56) References Cited

U.S. PATENT DOCUMENTS

| 3,220,604 A | * 11/1965 | Luginbuhl |
| 5,165,837 A | * 11/1992 | Schuppert, Jr. et al. . 221/251 X |
| 5,425,473 A | * 6/1995 | Kvalheim ............... 221/294 X |
| 5,730,317 A | * 3/1998 | Mitsushima et al. .... 221/236 X |

* cited by examiner

Primary Examiner—David H. Bollinger
(74) Attorney, Agent, or Firm—Wenderoth, Lind & Ponack, L.L.P.

(57) ABSTRACT

A rotary device has thereinside a driving device as a driving source for rotating a rotary block and opening and closing a shutter, and also includes a rod for transmitting a driving force to the rotary block and the shutter, a lever and a shaft for directly transmitting the driving force to the shutter, a spring for delaying a timing to open the shutter after the rotary block rises, a spring receiver for receiving the spring, and a joint for connecting the rod with the rotary block.

17 Claims, 18 Drawing Sheets

COMPONENT FEEDING METHOD AND APPARATUS

BACKGROUND OF THE INVENTION

The present invention relates to a component feeding apparatus and method and a component mounting apparatus having the component feeding apparatus to be used in a component mounting apparatus and method for sequentially mounting components stored in a stick (stick-shaped magazine) onto circuit formation bodies such as circuit boards, components, casings, frames, or the like, whereby components are sequentially supplied to a predetermined position, for example, a component feed position where a component holding member of the component mounting apparatus holds the component.

A stick is employed in one form of feeding components. A conventional feed method and an apparatus therefor will be described with reference to the drawings.

As shown in FIGS. 13 and 14, a component feeding apparatus of the type referred to above includes a holder 3 for holding a stick 1 storing components 2, an inclined chute 4 set with an inclination to pass the components 2 from the stick 1 and provided with a separating device 5 at a leading end part for separating the leading component only, and a rotary device 40 for holding and rotating the separated leading component 2 to a horizontal position 6.

The conventional rotary device 40 is constituted of a rotary block 42 set rotatably to a fulcrum 41 in the vicinity of the leading end of the inclined chute 4, a driving source 43 for rotating the rotary block 42, a lever 44 for transmitting a driving force of the driving source 43 to the rotary block 42, a shutter 45 which slides to open and close at normal times to prevent the component 2 from popping outside, a driving source 46 for opening and closing the shutter 45, and a lever 47 for transmitting a driving force of the driving source 46 to the shutter 45. Both the driving source 43 for the rotary device 40 and the driving source 46 for opening and closing the shutter 45 are set outside the apparatus to be shared with the other component feeding apparatuses.

The rotary device 40 presses the lever 44 through driving of the driving source 43, thereby rotating the rotary block 42 to move the leading component 2 to the horizontal position 6. Thereafter, the driving source 46 is driven to press the lever 47, whereby the shutter 45 slides to open. Then, the component 2 is sucked by a nozzle 82 of a head part 81 of a component mounting apparatus as shown in FIG. 12 and mounted to a printed board 84 by an XY robot 83 set for moving the head part 81.

In the above-described constitution, the apparatus has the driving sources set outside to be shared with the other component feeding apparatuses and therefore an availability is low. In order to hold and move the component 2 to the horizontal position 6, the apparatus uses both the driving source 43 for rotating the rotary block 42 and the driving source 46 for opening and closing the shutter 45 which is normally closed to prevent the popping-out of the component 2. As such, a driving operation timing as shown in FIG. 15 with which the driving source 45 and the driving source 46 operate constantly interlockingly is sometimes obstructed. A wide installation space is also required. In addition, the shutter of a slide system requires complicated assembling and processing of its components.

An object of the present invention is to solve the above issues and to provide a component feeding apparatus and method and a component mounting apparatus with the component feeding apparatus whereby a rotary device and a component pop-out preventing device for preventing components from popping outside can be driven by the same driving device set inside individually.

SUMMARY OF THE INVENTION

In order to accomplish the above objective, the present invention is constituted as follows.

According to a first aspect of the present invention, there is provided a component feeding apparatus for feeding components to a predetermined position, which comprises:

a holder for holding a stick capable of storing the components;

an inclined chute set with an inclination so that the components can slide in an array from the stick;

a separating device for separating only a leading component in the inclined chute from the other components;

a rotary device including a rotary member for holding the leading component separated by the separating device, which moves the rotary member from a component hold position inclined along the inclined chute where the leading component separated by the separating device is to be held by the rotary member, to a component feed position where the component is to be placed in a position for component supply;

a component pop-out preventing device which prevents the leading component held by the rotary member from popping outside for a period after the leading component separated by the separating device is held at the component hold position by the rotary member before the rotary member reaches the component feed position, and releases the leading component held by the rotary member after the rotary member reaches the component feed position; and a single driving device for moving the rotary member of the rotary device between the component hold position and the component feed position and causing the component pop-out preventing device to release the leading component at the component feed position of the rotary member.

According to a second aspect of the present invention, there is provided a component feeding apparatus according to the first aspect, in which the driving device linearly moves a rod between a front position and a back position, so that at the back position of the rod, the rotary member is positioned at the component hold position and the leading component held by the rotary member is prevented from popping outside by the component pop-out preventing device, while at the front position of the rod, the leading component held by the rotary member is released by the component pop-out preventing device after the rotary member is positioned at the component feed position.

According to a third aspect of the present invention, there is provided a component feeding apparatus according to the first or second aspect, in which the driving device comprises:

an air cylinder for linearly moving the rod between the front position and the back position; and an urging member for urging the rotary member to rotate to the component feed position, having an urging force regulated at the back position of the rod, so that the rotary member is positioned at the component hold position at the back position of the rod, then the rotary member is urged to rotate to the component feed position by the urging force of the urging member through deregulation of the urging force of the urging member when the rod moves from the back position to the front position, and a driving force from the rod is transmitted, thereby causing the component pop-out preventing device to release the leading component held by the rotary member when the rod reaches the front position after the rotary member is urged to rotate to the component feed position.

According to a fourth aspect of the present invention, there is provided a component feeding apparatus in any one of the first through third aspects in which the component pop-out preventing device comprises:

- a shutter set openably relative to the rotary member, for movement between a component pop-out prevention position for preventing the leading component from popping outside and a retreat position for releasing the leading component;
- a shaft coupled to the shutter;
- a lever coupled to the shutter via the shaft and which comes in contact with the rod of the driving device when the rod linearly moves, thereby rotating the shutter from the component pop-out prevention position to the retreat position; and
- an urging member for always urging the shutter to rotate from the retreat position to the component pop-out prevention position.

According to a fifth aspect of the present invention, there is provided a component feeding apparatus according to any one of the first through fourth aspects in which the rotary member is supported rotatably about a fulcrum, so that the rotary member is positioned at the component hold position when the rod of the driving device linearly moves and reaches the back position, while the rotary member is positioned at the component feed position when the rod reaches the front position.

According to a sixth aspect of the present invention, there is provided a component feeding apparatus according to any one of the first through fifth aspects, in which the rotary member has a groove for receiving the leading component from the inclined chute at the component hold position, a first stopper for regulating a leading end side of the leading component received in the groove to not move, and a second stopper which comes out of the groove at the component hold position, and projects into the groove while the rotary member is moving from the component hold position to the component feed position immediately after the rotary member starts moving from the component hold position towards the component feed position and at the component feed position, thereby regulating a rear end side of the leading component received in the groove to not move.

According to a seventh aspect of the present invention, there is provided a component feeding apparatus according to any one of the first through sixth aspects, in which the separating device comprises:

- an engagement part for entering between the leading component and a second component adjacent to the leading component in the inclined chute, thereby regulating the second component to not move;
- a lever for inserting the engagement part between the leading component and the second component in the inclined chute; and
- an urging member for driving the lever when the rod of the driving device linearly moves and reaches the back position, thereby inserting the engagement part between the leading component and the second component in the inclined chute to regulate the component to not move,
  - so adapted that the lever is driven oppositely through the linear movement of the rod of the driving device when the rod linearly moves to reach the front position, thereby releasing the movement regulation of the second component by the engagement part.

According to an eighth aspect of the present invention, there is provided a component feeding apparatus according to any one of the first through seventh aspects in which the inclined chute has a movement regulation member for regulating the leading component in the inclined chute to not drop from the inclined chute when the rotary member is present at a position other than the component hold position, wherein the movement regulation of the leading component in the inclined chute by the movement regulation member is released by the rotary member when the rotary member is present at the component hold position, thereby enabling the leading component to be received from the inclined chute by the rotary member.

According to a ninth aspect of the present invention, there is provided a component mounting apparatus in which a component supplied from the component feeding apparatus in any one of the first through eighth aspects, after being held by a component holding member, is mounted to a predetermined position of a circuit formation body.

According to a 10 th aspect of the present invention, there is provided a component feed method for feeding components to a predetermined position, which comprises:

- separating only a leading component from the other components in an inclined chute set with an inclination so that the components can slide in an array from a stick capable of storing the components;
- holding the separated leading component at a rotary member present at a component hold position inclined along the inclined chute;
- transmitting a driving force from a single driving device to a rotary device and a component pop-out preventing device, thereby holding the leading component to the rotary member present at the component hold position, then moving the rotary member by the rotary device to a component feed position where the component is to be placed in a position for component supply, causing the component pop-out preventing device to prevent the leading component held by the rotary member from popping outside after the leading component is held at the component hold position before the rotary member reaches the component feed position, and releasing the leading component held by the rotary member after the rotary member reaches the component feed position.

According to an 11 th aspect of the present invention, there is provided a component feed method of the 10 th aspect, in which the single driving device linearly moves a rod between a front position and a back position, so that at the back position of the rod, the rotary member is positioned at the component hold position and the leading component held by the rotary member is prevented from popping outside by the component pop-out preventing device, while at the front position of the rod, the leading component held by the rotary member is released in the component pop-out preventing device after the rotary member is positioned at the component feed position.

According to a 12 th aspect of the present invention, there is provided a component feed method according to the 10 th or 11 th aspect in which the driving device includes an air cylinder for linearly moving the rod between the front position and the back position, and an urging member for urging the rotary member to rotate to the component feed position, having the urging force regulated at the back position of the rod, so that the rotary member is positioned at the component hold position at the back position of the rod, and the rotary member is urged to rotate to the component feed position by the urging force of the urging member through deregulation of the urging force of the urging member when the rod moves from the back position to the front position, and a driving force from the rod is transmitted when the rod reaches the front position after the rotary member is urged to rotate to the component feed position, thereby causing the component pop-out preventing device to release the leading component held by the rotary member.

According to a 13 th aspect of the present invention, there is provided a component feed method in any one of the 10 th through 12 th aspects, in which the component pop-out preventing device prevents the leading component from popping outside when a shutter openably set relative to the rotary member reaches a component pop-out prevention position, as well as releases the leading component when the shutter reaches a retreat position, wherein the driving force from the rod of the driving device is transmitted when the rod linearly moves, thereby rotating the shutter from the component pop-out prevention position to the retreat position, while the shutter is always urged by the urging member to rotate from the retreat position to the component pop-out prevention position.

According to a 14 th aspect of the present invention, there is provided a component feed method in any one of the 10 th through 13 th aspects, wherein the rotary member rotates about a fulcrum thereby being positioned at the component hold position when the rod of the driving device linearly moves and reaches the back position, and moreover the rotary member rotates about the fulcrum thereby being positioned at the component feed position when the rod reaches the front position.

According to a 15 th aspect of the present invention, there is provided a component feed method in any one of the 10 th through 14 th aspects, which further comprises:

receiving the leading component into a groove of the rotary member from the inclined chute at the component hold position when the separated leading component is to be held by the rotary member;

regulating a leading end side of the leading component received in the groove to not move, by use of a first stopper; and regulating a rear end side of the leading component received in the groove to not move, by use of a second stopper which projects into the groove while the rotary member is moving from the component hold position to the component feed position immediately after the rotary member starts moving from the component hold position towards the component feed position and at the component feed position.

According to a 16 th aspect of the present invention, there is provided a component feed method according to any one of the 10 th through 15 th aspects, which comprises:

inserting an engagement part between the leading component and a second component adjacent to the leading component in the inclined chute when only the leading component in the inclined chute is to be separated from the other components, thereby regulating the second component to not move;

when a rod of the driving device linearly moves and then reaches the front position, driving a lever oppositely through linear movement of the rod, thereby releasing the movement regulation of the second component by the engagement part.

According to a 17 th aspect of the present invention, there is provided a component feed method of any one of the 10 th through 16 th aspects, in which in the inclined chute, regulating the leading component in the inclined chute by a movement regulation member to not drop out of the inclined chute when the rotary member is positioned at a position other than the component hold position, while releasing, by the rotary member, the movement regulation of the leading component in the inclined chute by the movement regulation member when the rotary member is present at the component hold position, thus enabling the leading component to be received from the inclined chute to by the rotary member.

BRIEF DESCRIPTION OF THE DRAWINGS

These and other aspects and features of the present invention will become clear from the following description taken in conjunction with the preferred embodiments thereof with reference to the accompanying drawings, in which:

FIG. 16 is a perspective view of a second stopper-driving mechanism of the component feeding apparatus in the embodiment;

DETAILED DESCRIPTION OF THE PREFERRED EMBODIMENTS

Figure 1:
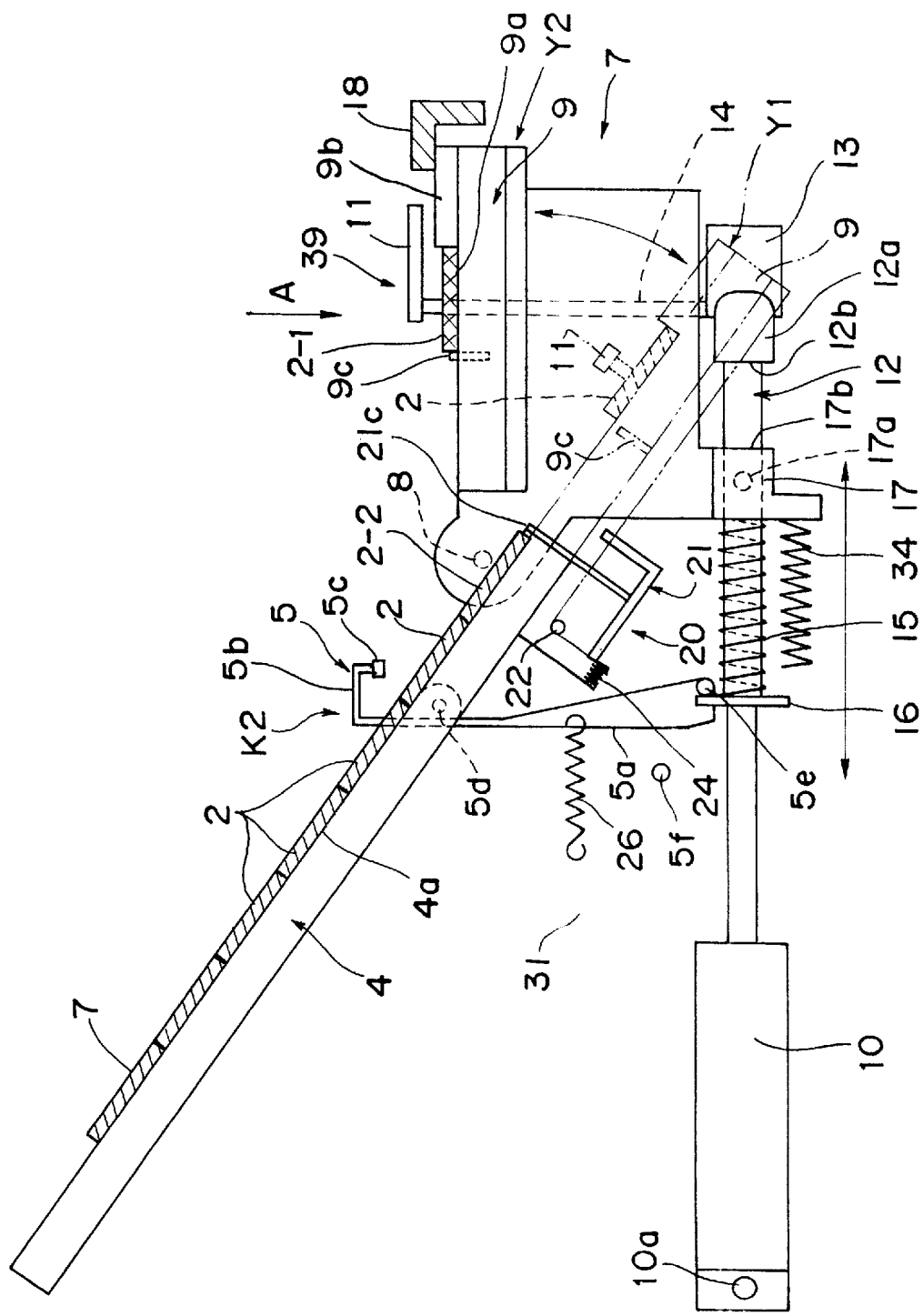
FIG. 1 is a schematic partial side view of a component feeding apparatus according to one embodiment of the present invention.

Before the description of the present invention proceeds, it is to be noted that like parts are designated by like reference numerals throughout the accompanying drawings.

An embodiment of the present invention will be described in detail with reference to the drawings.

EMBODIMENT 1

Figure 2:
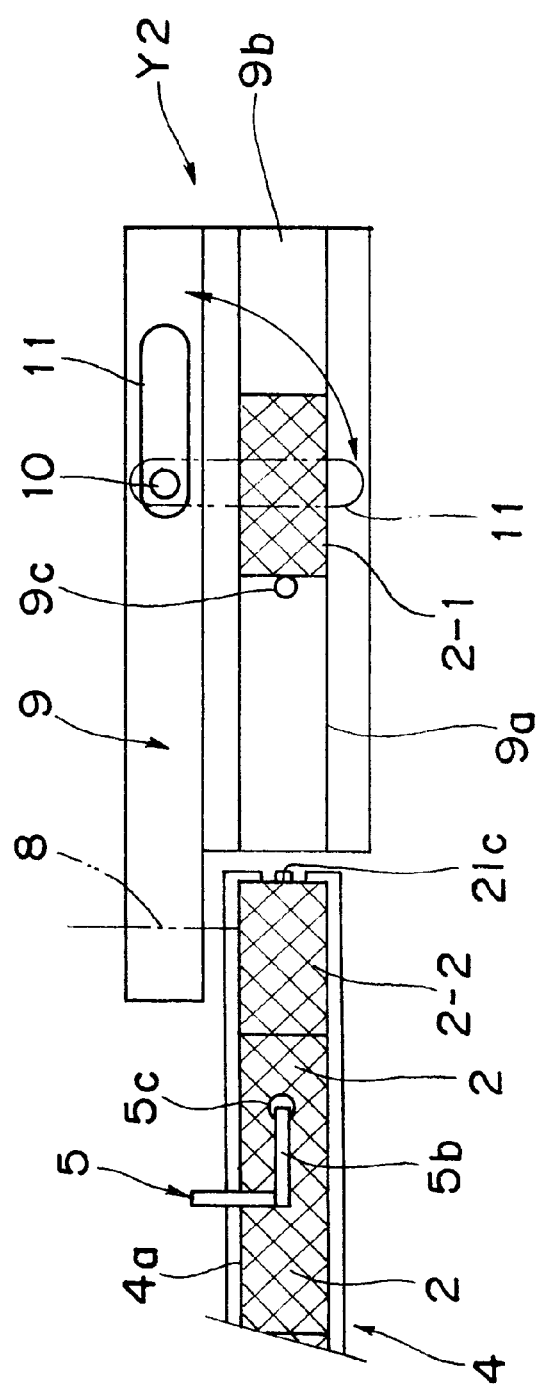
FIG. 2 is a view seen from a direction of an arrow A of FIG. 1.
Figure 3:
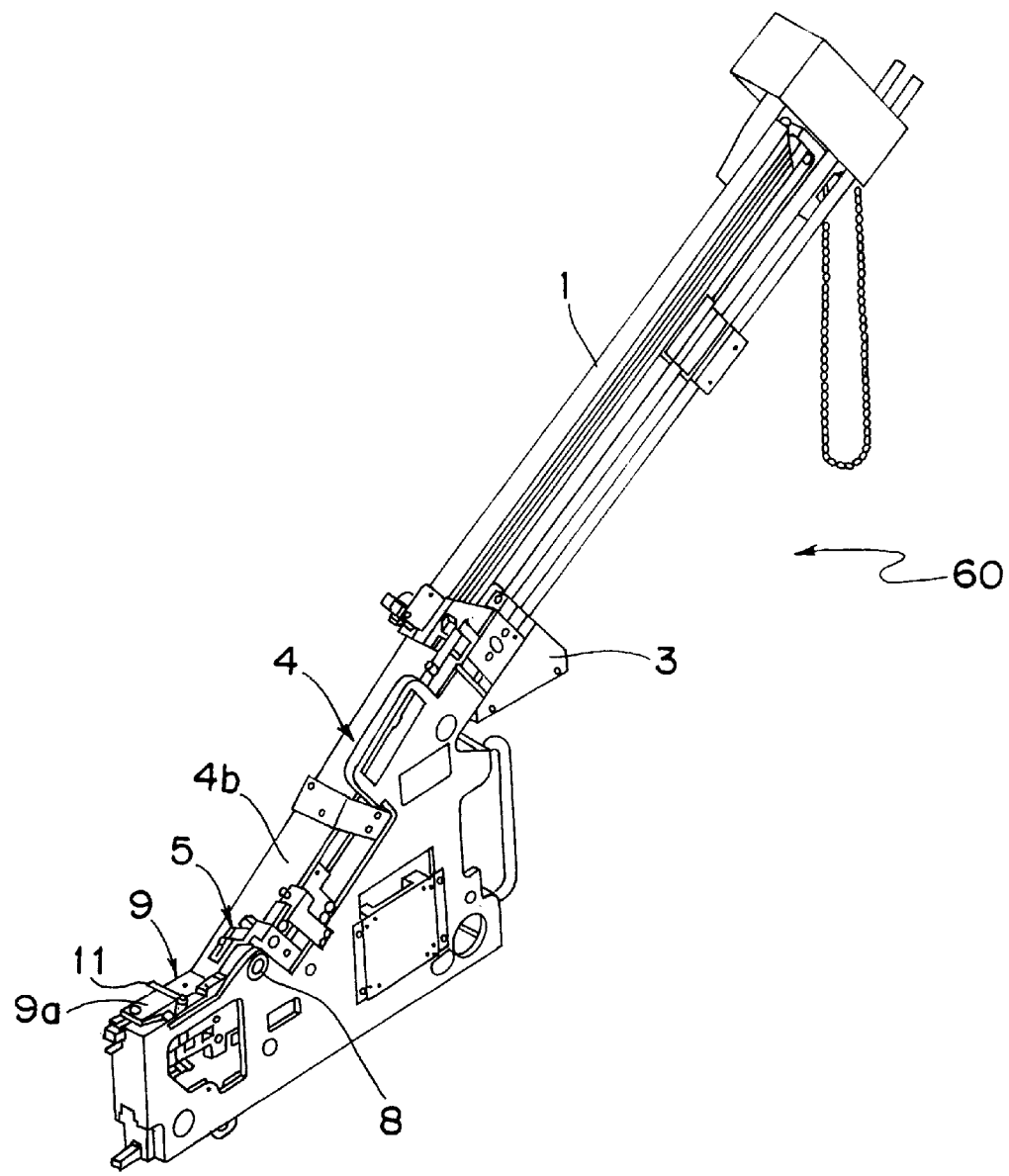
FIG. 3 is an entire view of the component feeding apparatus in the embodiment.
Figure 4:
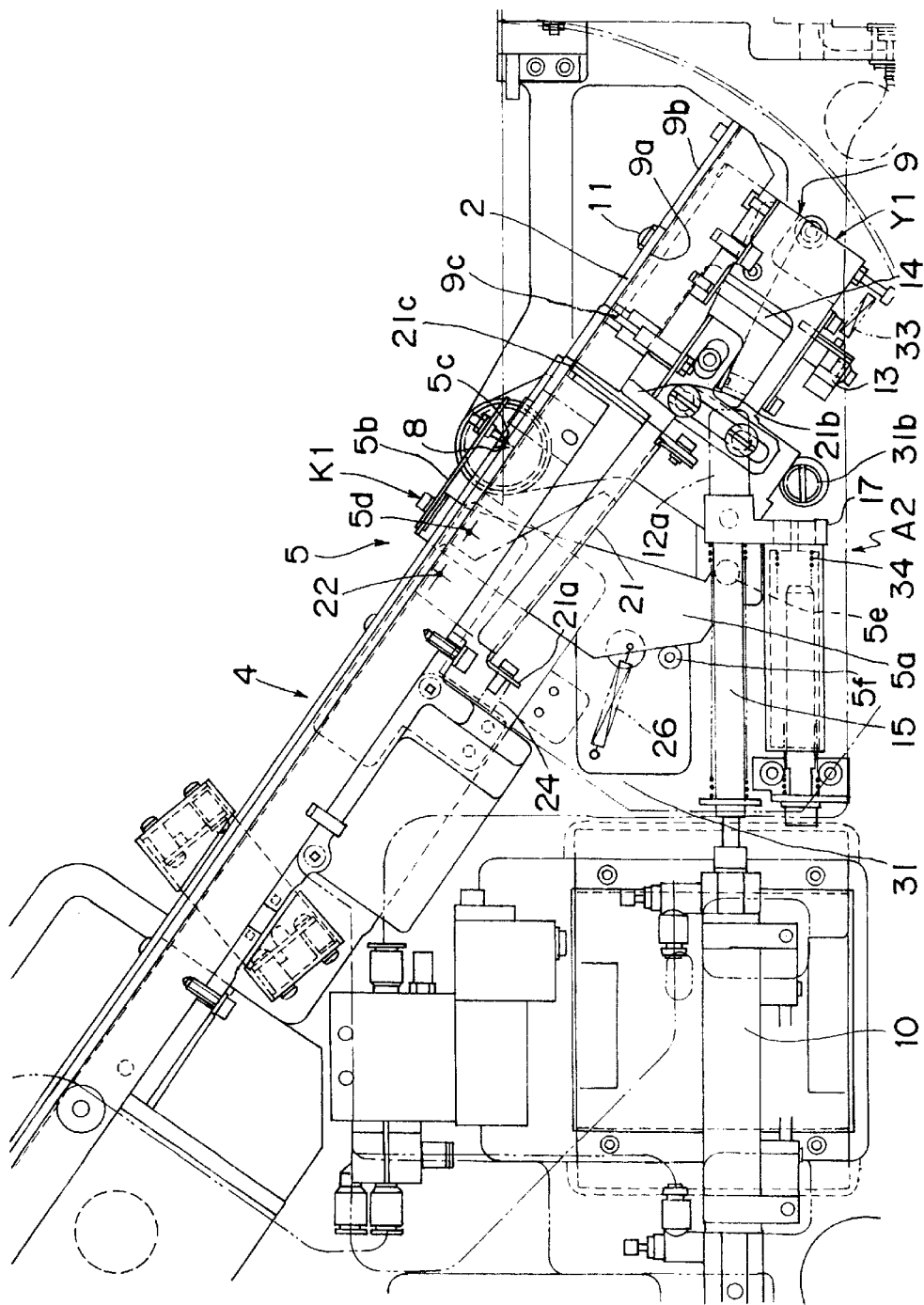
FIG. 4 is a detailed partial side view of the component feeding apparatus in a state in which a rotary block receives a component from an inclined chute of the component feeding apparatus.
Figure 5:
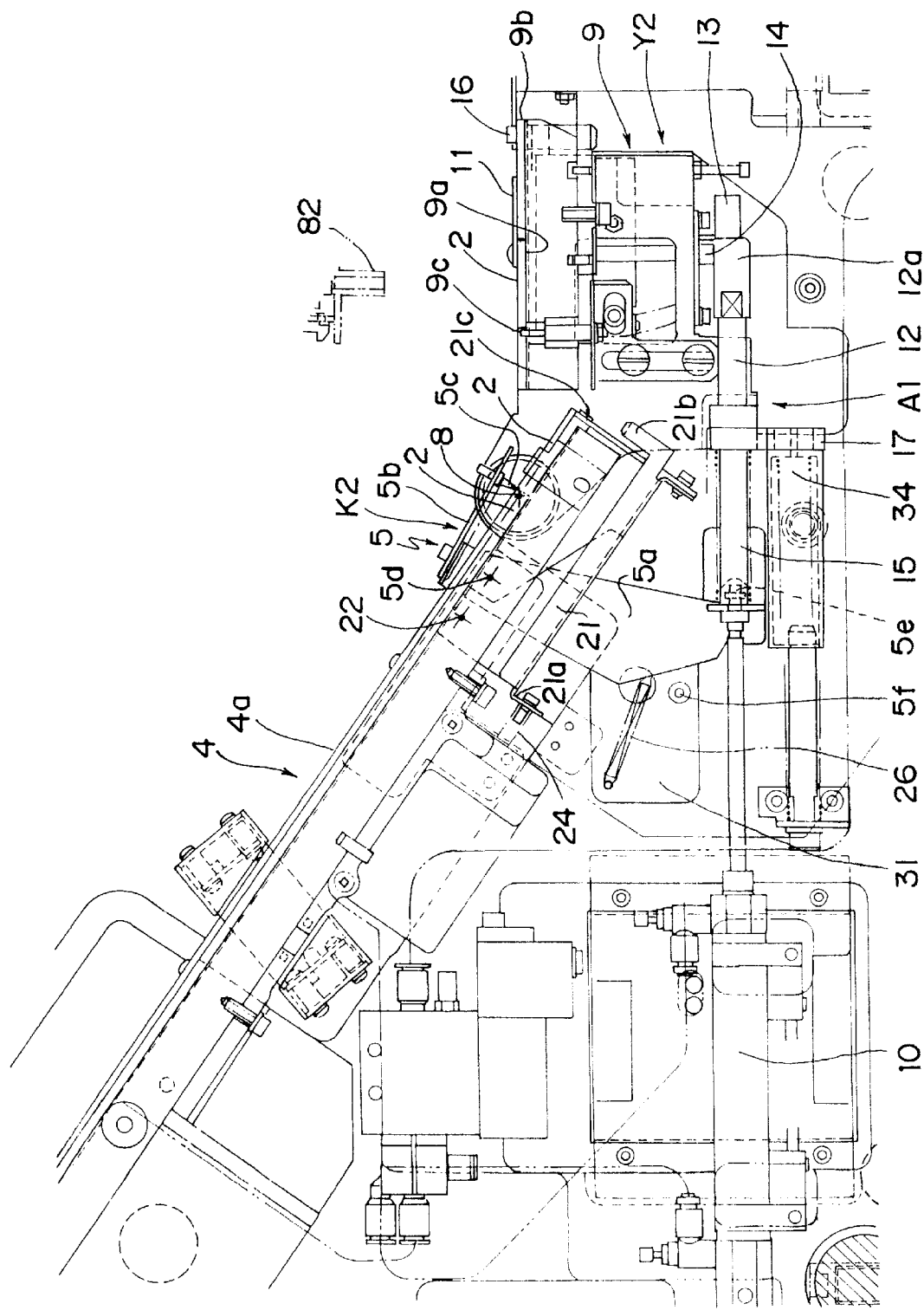
FIG. 5 is a detailed partial side view of the component feeding apparatus in a state in which the component held by the rotary block of the component feeding apparatus stays at a component feed position.
Figure 6:
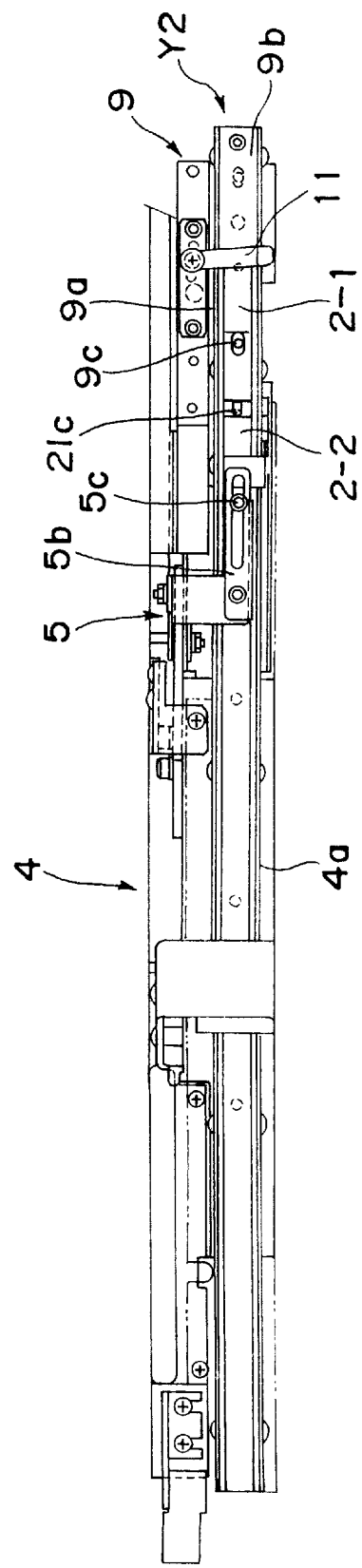
FIG. 6 is a detailed partial bottom view of the component feeding apparatus in the state of FIG. 4.
Figure 7:
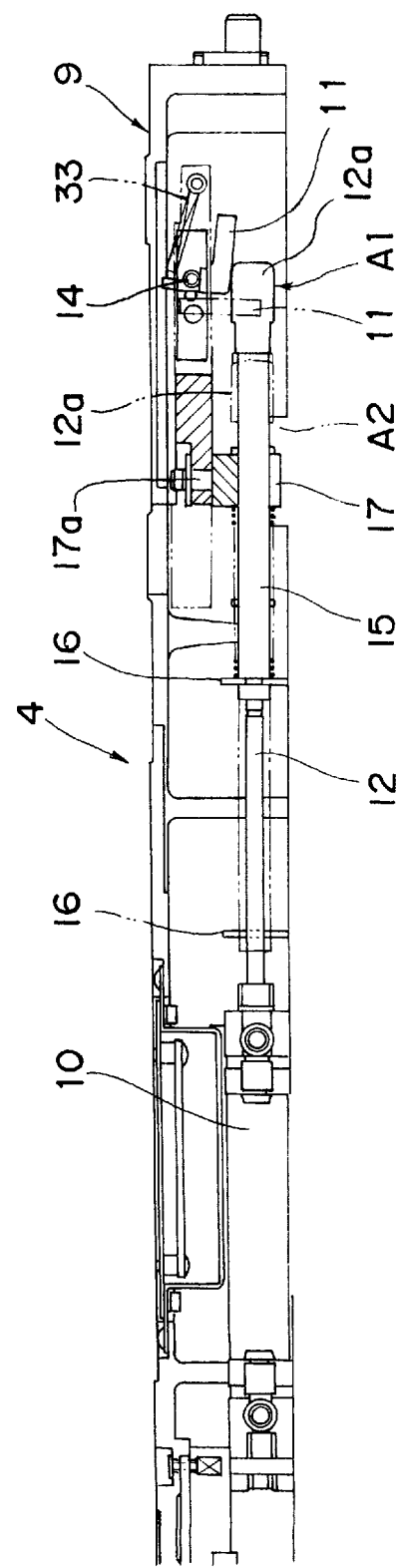
FIG. 7 is a detailed partial bottom view of the component feeding apparatus in the state of FIG. 5.

As is schematically shown in FIGS. 1–3, a component feeding apparatus 60 which executes a component feed method according to an embodiment of the present invention is so constituted that after a component 2 supplied from a lowest position of an inclined chute 4 has been received and held on a rotary block 9 which is one example of a rotary member, while the component 2 held by the rotary block is prevented from popping outside and being displaced, the rotary block 9 is moved from an incline position (i.e., a component hold position) Y1 in FIG. 4 inclined along the inclined chute to a horizontal position (i.e., a component feed position, e.g., a horizontal position in FIG. 1 or the like) Y2 of FIG. 5 where the component 2 is placed in a lateral direction for component supply, through driving of a driving device constructed by an air cylinder 10 and a spring 15, and then a component 2 next to be held by the rotary block 9 is prepared by being moved to the lowest position of the inclined chute 4.

More specifically, the above component feeding apparatus 60 comprises, as indicated in FIGS. 1–7, a holder 3 for holding a stick 1 (stick-shaped magazine) storing components 2, the inclined chute 4 set with such an inclination as to pass the components 2 in an array from the stick 1 and having a separating device 5 at a leading end part thereof for separating only a component 2-1 at the head of the array, namely, at a lowest end among the other components 2, . . . , 2, and a rotary device 7 for holding the head component 2 separated from the other components 2, . . . , 2 by the rotary block 9 and moving the component to the horizontal position Y2. FIG. 1 shows a state in which only the lowest component 2-1 is held by the rotary block 9 and a component 2-2 adjacent to the lowest component 2-1 and second from the lowest end is located at a lowest end of the inclined chute 4.

The inclined chute 4 has a component guide groove 4a of a breadth slightly larger than a breadth of the component 2. Many components 2, . . . , 2 are stored in an array in the groove 4a. Each component 2 guided by the groove 4a can move by sliding down due to gravity. The groove 4a is normally covered with a lid 4b (referring to FIG. 3).

For instance, when the lowest component 2-1 in the groove 4a is received from inside the groove 4a by the rotary block 9 which will be discussed later, the remaining components 2, . . . , 2 in the groove 4a together or sequentially slide down in the groove 4a, so that the next component 2-2 is placed at the lowest end of the groove 4a. A rectangular plate-like one is illustrated as an example of the component 2, but the component 2 is not limited to this.

The above driving device generally consists of the air cylinder 10 and the spring 15. The air cylinder 10 has its rear end supported by an apparatus frame 31 by a pin 10a to be slightly rotatable about the pin 10a. The air cylinder 10 linearly moves a rod 12 back and forth between a front position A1 (a position indicated by a solid line in FIG. 7, referring to FIG. 5) and a back position A2 (a position indicated by a two-dot chain line in FIG. 7, referring to FIG. 4), working as a direct driving source for opening and closing a shutter 11. The spring 15, which is arranged at an outer circumferential face of the rod 12 between a joint 17 of the rotary block 9 (to be described later) and a spring receiver 16 fixed to the rod 12, functions as an example of an urging member for urging the rotary block 9 from the incline position Y1 towards the horizontal position.

Figure 8:
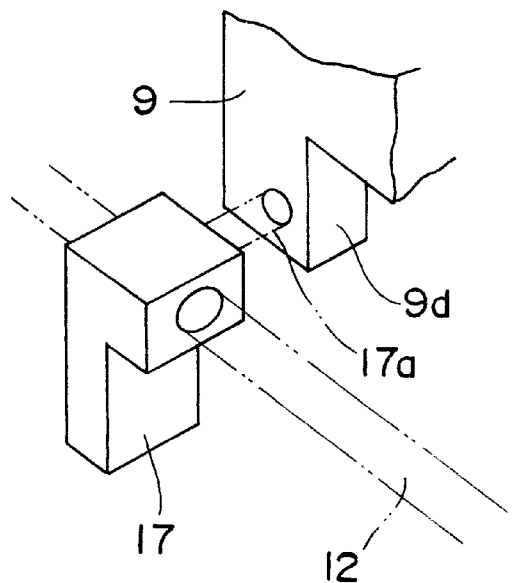
FIG. 8 is a partial perspective view indicating a connection relationship of the rotary block and a rod of the component feeding apparatus.

The rotary device 7 includes, as shown in FIGS. 1 and 2, the rotary block 9 set rotatably about a supporting shaft 8 which is a fulcrum in the vicinity of the leading end of the inclined chute 4, the spring receiver 16 fixed to a middle part of the rod 12, and the ring-shaped joint 17 which is fitted movably in its axial direction to the rod 12 between a leading end part 12a of the rod 12 and the spring receiver 16 and is coupled by a pin 17a to a lower end part 9d of the rotary block 9 as shown in FIG. 8 as well, thereby converting a linear motion of the rod 12 to a rotary motion of the rotary block 9 about the supporting shaft 8. A spring 34 as an example of the urging member is installed between the joint 17 and the apparatus frame 31, so that a rear end face 12b of the leading end part 12a of the rod 12 comes into contact with a front end face 17b of the joint 17 when the rod 12 is positioned at the back position A2.

Through the rotary motion of the rotary block 9 about the supporting shaft 8, the pin 17a coupling the rod 12 and the joint 17 moves somewhat in an arc about the supporting shaft 8. However, the arc movement does not influence the rotary motion of the rotary block 9 because the rear end of the air cylinder 10 is rotatably supported by the pin 10a.

The rotary block 9 has a groove 9a formed at an upper face thereof. The groove 9a communicates with the groove 4a of the inclined chute 4 at the incline position Y1. A bottom face of the groove 9a of the rotary block 9 is made schematically even with a bottom face of the groove 4a of the inclined chute 4, so that only one component 2 is received from the groove 4a of the inclined chute 4 and held in the groove 9a. At the downstream side of the groove 9a of the rotary block 9 (at the right end side in FIGS. 2 and 6) is fixed a first stopper 9b in the form of a plate which comes in contact with the component 2 in the groove 9a to prevent the component from slipping. Moreover, at the upstream side of the groove 9a (at the left side of the component in FIGS. 2 and 6), a second stopper 9c is arranged in a manner to be inserted and extracted in a direction penetrating the bottom face of the groove. By projecting into the groove 9a, the second stopper stops the component 2 from slipping off. By way of example, an angle between the horizontal position Y2 and the incline position Y1 is set to approximately 35°.

The rotary block 9 is positioned at the incline position Y1 by being moved about the supporting shaft 8 and coming into contact with a lower stopper 31b. As a result, the groove 9a and the groove 4a of the inclined chute 4 communicate with each other. The only one component 2-1 of the lowest end is received from the groove 4a of the inclined chute 4 and slides into the groove 9a to be in contact with the first stopper 9b thereby being positioned and held in the groove 9a. At this time, the component 2-2 adjacent to the lowest-end component 2-1 and second from the lowest end in the groove 4a of the inclined chute 4 is engaged by an engagement part 5c of the separating device 5 which will be described later and therefore does not move toward the rotary block 9. Meanwhile, the rotary block 9, upon coming into contact with an upper stopper 18, is positioned at the horizontal position Y2 by movement about the supporting shaft 8, so that the component held in the groove 9a can be positioned at the component feed position. In the groove 9a, the one component 2 can be positioned by the first stopper 9b and the second stopper 9c in the groove 9a to be correctly present at the component feed position.

Figure 17:
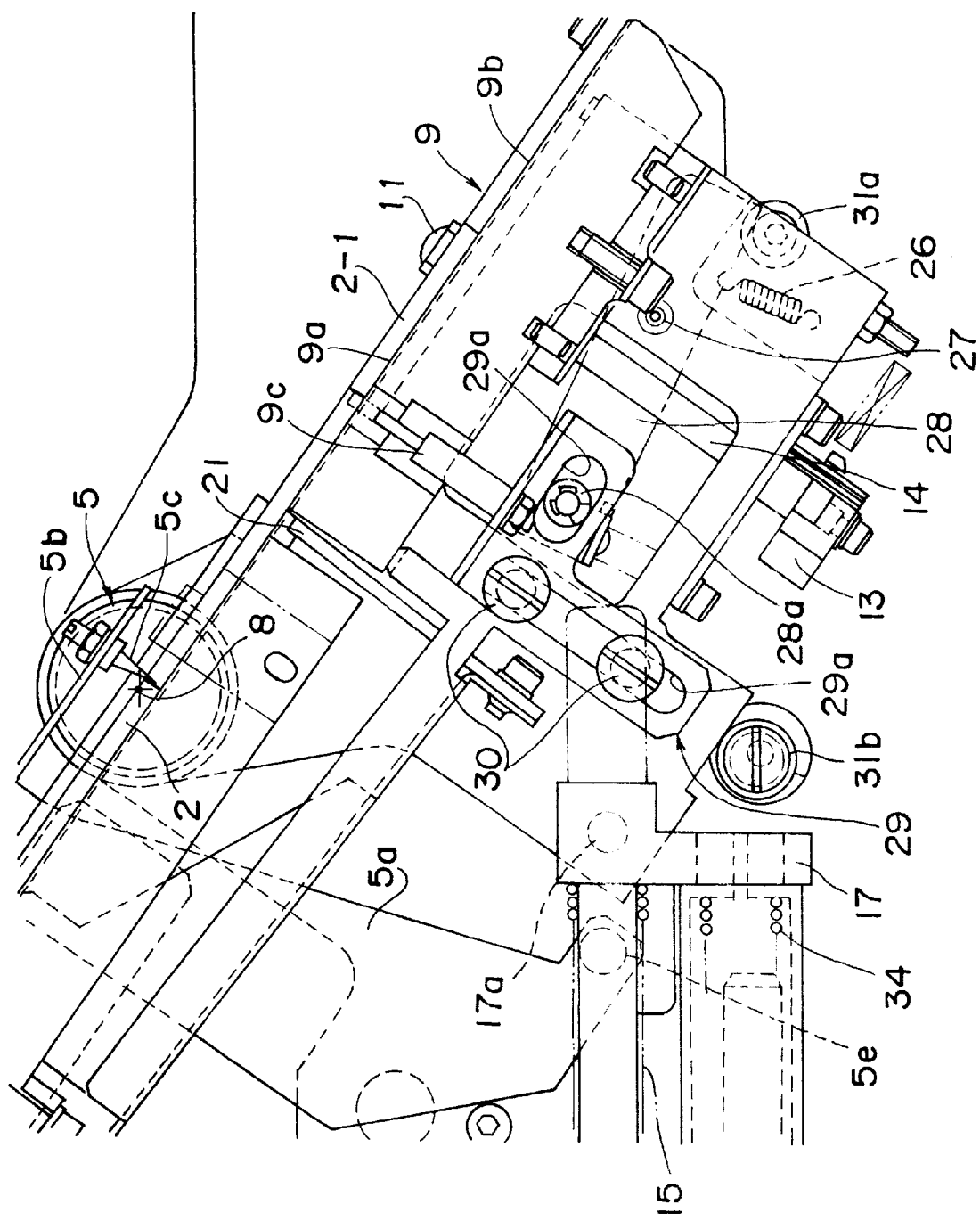
FIG. 17 is a detailed enlarged side view of the second stopper-driving mechanism of the component feeding apparatus of the embodiment.

Referring to FIGS. 16 and 17, a driving mechanism 25 for the second stopper 9c is constituted as will be described below. The driving mechanism comprises a lever 28 rotatable about a supporting shaft 27 fixed to the rotary block 9, a lever stopper 31a secured to the apparatus frame 31 of the component feeding apparatus 60 which comes in contact with one end of the lever 28 immediately before the rotary block 9 is positioned at the incline position Y1, thereby forcibly rotating the lever 28 in the counterclockwise direction about the supporting shaft 27 in FIG. 16, a spring 32 as an example of the urging member set between the one end of the lever 28 and the rotary block 9 for urging the lever 28 to rotate forcibly in the clockwise direction about the supporting shaft 27, and a stopper main body 29 to an upper face of which the second stopper 9c extends and which has a long hole 29b elongated in a lateral direction in which a roller 28a of the lever 28 is movably inserted and a long hole 29a elongated in a longitudinal direction in which two guide pins 30, 30 secured to the rotary block 9 are inserted. When the rotary block 9 is present at a position other than the incline position, the lever 28 is forcibly rotated about the supporting shaft 27, in the clockwise direction in FIG. 16 by an urging force of the spring 32, the roller 29b rolls in the lateral long hole 29b of the stopper main body 29, the stopper main body 29 moves up in FIG. 16 under the guidance of the longitudinal long hole 29a of the stopper main body 29 and the two guide pins 30, 30, the second stopper 9c at the upper face of the stopper main body 29 projects from the groove 9a of the rotary block 9, and accordingly the component 2 is prevented from slipping off. On the other hand, immediately before the rotary block 9 reaches the incline position Y1, the lever 28 touches the lever stopper 31a thereby being forcibly rotated against the urging force of the spring 32 about the supporting shaft 27 in the counterclockwise direction in FIG. 16, the roller 29b rolls in the lateral long hole 29b of the stopper main body 29, the stopper main body 29 moves down in FIG. 16 by the guidance of the longitudinal long hole 29a of the stopper main body 29 and two guide pins 30, 30, and the second stopper 9c at the upper face of the stopper main body 29 comes out of the groove 9a of the rotary block 9, whereby the component 2 can be received in the groove 9a. An upper limit of the stopper main body 29 is a position where a lower end of the longitudinal long hole 29a of the stopper main body 29 touches the lower guide pin 30.

Figure 9:
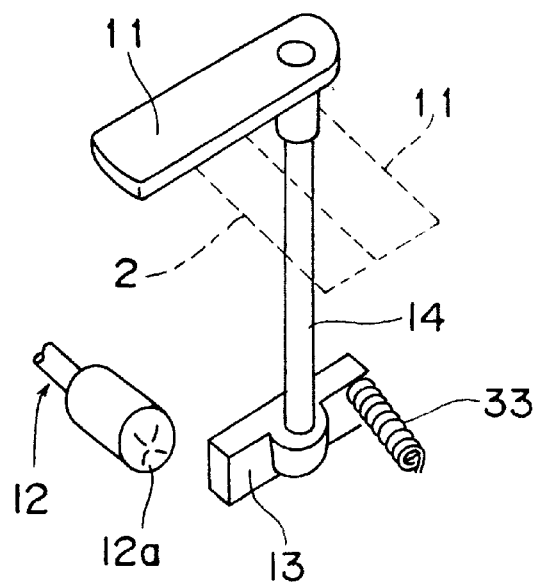
FIG. 9 is a partial perspective view of a component pop-out preventing device of the component feeding apparatus.
Figure 10:
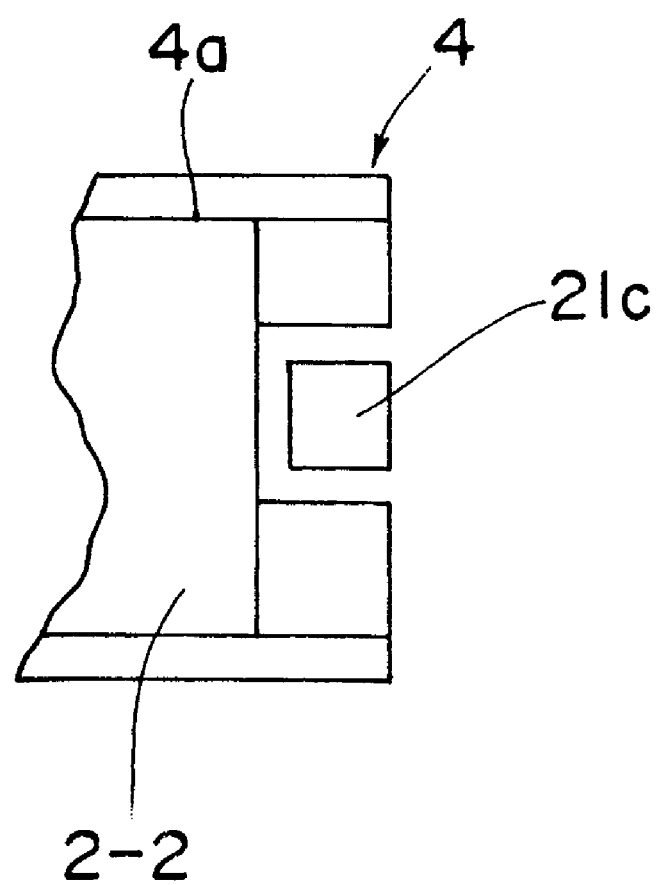
FIG. 10 is a partial plan view of a component movement regulating device of the component feeding apparatus.

The apparatus is equipped with a component pop-out preventing device 39 for preventing the component 2 held by the rotary block 9 from popping outside during the rotation of the rotary block 9 from the incline position Y1 to the horizontal position Y2. The component pop-out preventing device 39 includes the shutter 11 for preventing the component 2 held by the rotary block 9 from popping outside during the rotation of the rotary block 9 between the incline position Y1 and the horizontal position Y2, a lever 13 and a shaft 14 for directly transmitting a driving force of the air cylinder 10 to the shutter 11. The shaft 14 is supported rotatably for forward and rearward movement of the shutter 11 relative to the rotary block 9. The shutter 11 formed of a slim plate is fixed to an upper end of the shaft 14 and the lever 13 is fixed to a lower end of the shaft 14. As shown in FIGS. 4, 5, and 9, a spring 33 as an example of the urging member is set between the lever 13 and the rotary block 9, which urges the shutter 11 to rotate via the lever 13 and shaft 14 so that the shutter 11 is normally present at a pop-out prevention position where the shutter 11 normally intersects the groove 9a at the upper face of the rotary block 9 to prevent the component 2 in the groove 9a from popping outside. The leading end part 12a of the rod 12 of the air cylinder 10 comes into contact with the lever 13 at the front position, thereby rotating the lever 13 about an axis of the shaft 14 to move the shutter 11 from the pop-out prevention position to a retreat position via the lever 13 and shaft 14 in spite of the urging force of the spring 33.

As shown in FIGS. 1, 4, and 5, the component-separating device 5 has a lever 5a rotatable about a supporting shaft 5d between an engagement position K1 and an engagement release position K2, and the engagement part 5c at a leading end of a driving plate 5b secured to an upper end of the lever 5a. A spring 26 is fitted between a part of the lever 5a below the supporting shaft 5d and the apparatus frame 31. The lever 5a is normally urged by an urging force of the spring 26 to rotate in the clockwise direction towards the engagement position K1 to come into contact with a stopper 5f. A projection 5e projects in the lateral direction at a lowest end of the lever 5a, which is arranged within a movement locus of the spring receiver 16 fixed to the rod 12 to be able to come in contact with the spring receiver 16. Therefore, when the rotary block 9 is at the incline position Y1, the urging force of the spring 26 urges and rotates the lever 5a in the clockwise direction to the engagement position K1, whereby the lever 5a comes into contact with the stopper 5f and is positioned at the engagement position K1. The engagement part 5c enters between the component 2-1 of the lowest end of the inclined chute 1 and the component 2-2 second from the lowest end, thereby preventing the component 2-2 second from the lowest end from sliding. On the other hand, when the rod 12 is driven to move right in FIGS. 1 and 4 to move the rotary block 9 from the incline position Y1 to the horizontal position Y2, the spring receiver 16 fixed to the rod 12 moves the projection 5e of the lowest end of the lever 5a to the right. Thus, the lever 5a is forcibly rotated against the urging force of the spring 26 in the counterclockwise direction from the engagement position K1 to the engagement release position K2. The engagement at the component 2-2 second from the lowest end is thus freed, allowing the component 2-2 second from the lowest end to slide to the lowest end of the inclined chute 4.

Meanwhile, as indicated in FIGS. 1, 4, 5, and 10, when the rotary block 9 rotates between the incline position Y1 and the horizontal position Y2, a component movement-regulating device 20 regulates the component 2 to prevent it from dropping to drop from the inclined chute 4. The component movement-regulating device 20 is constituted of a lever 21 rotatable about a supporting shaft 22. The lever 21 has a spring 24 set as an example of the urging member between one end 21a of the lever 21 and the inclined chute 4, an L-shaped-bent rotary block contact part 21b and a movement regulation pin 21c as an example of the movement-regulating member set to the other end. When the rotary block 9 is present at a position other than the incline position Y1, the movement regulation pin 21c of the lever 21 enters and projects from below to the lowest end of the groove 4a of the inclined chute 4 because of an urging force of the spring 24, thereby regulating the component 2 to prevent it from moving from the groove 4a to the rotary block. Immediately before the rotary block 9 reaches the incline position Y1, part of the rotary block 9 touches the rotary block contact part 21*b* and forcibly rotates the lever 21 against the urging force of the spring 24 in the clockwise direction about the supporting shaft 22. In consequence of this, the movement regulation pin 21*c* slips out of the groove 4*a* of the inclined chute 4, allowing the component 2-1 at the lowest end of the groove 4*a* of the inclined chute 4 to slide out of the groove 4*a* and move by its own weight into the groove 9*a* of the rotary block 9 present at the incline position Y1.

An inclination angle at the incline position Y1 of the inclined chute 4 and the rotary block 9 is set to be about an angle enabling the component 2 to slide.

The operation of the thus-constituted component feeding apparatus 60 will be described below.

When the rotary block 9 is present at the incline position Y1 as in FIG. 4, that is, when the rod 12 is present at the back position A2 by the driving of the air cylinder 10, the rear end face 12*b* of the leading end part 12*a* of the rod 12 comes into contact with the front end face 17*b* of the joint 17 because of the urging force of the spring 34 and forcibly moves the joint 17 left in FIG. 1 while compressing the spring 15. The rotary block 9 is consequently rotated in the clockwise direction about the supporting shaft 8 to come into contact with the stopper 31*b* and then, is kept positioned at the incline position Y1. In this state, the engagement part 5*c* of the separating device 5 is present at the engagement position K1 to regulate the component 2-2 second from the lowest end in the groove 4*a* of the inclined chute 4 to not slide downward. At the same time, the rotary block contact part 21*b* of the component movement-regulating device 20 is pressed down by the rotary block 9, and the movement regulation pin 21*c* of the component movement-regulating device 20 slips out of the groove 4*a* downward at the lowest end of the groove 4*a* of the inclined chute 4 to free the movement regulation. Accordingly, the component 2-1 at the lowest end slides down by its own weight into the groove 9*a* of the rotary block 9 forming a nearly even bottom face with the bottom face of the groove 4*a* of the inclined chute 4, where the component 2-1 is regulated in movement by the first stopper 9*b* and held in the groove 9*a*. At this time, the shutter 11 rests at the pop-out prevention position to intersect the groove 9*a* to prevent the component 2 from popping out of the groove 9*a*. In the driving mechanism 25 for the second stopper 9*c*, since the stopper main body 29 is moved down through contact of the lever 28 with the lever stopper 31*a*, the second stopper 9*c* comes out of the groove 9*a* of the rotary block 9 and therefore never obstructs the component 2 from being received from the groove 4*a* of the inclined chute 4 into the groove 9*a* of the rotary block 9.

When the lowest component 2-1 in the groove 4*a* of the inclined chute 4 is to be received in the groove 9*a* of the rotary block 9, the engagement part 5*c* of the separating device 5 is present at the engagement position K1 thereby regulating the downward slide of the component 2-2 second from the lowest end in the groove 4*a* of the inclined chute 4. Therefore, only the lowest component 2-1 moves and is received in the groove 9*a* of the rotary block 9.

After the component 2-1 of the lowest end is received in the groove 9*a* of the rotary block 9 in the manner as described hereinabove, in order to move the rotary block 9 from the incline position Y1 to the horizontal position Y2, the rod 12 is moved from the back position A2 to the front position A1 by driving the air cylinder 10. At this time, firstly in a state where the rear end face 12*b* of the leading end part 12*a* of the rod 12 is held in contact with the front end face 17*b* of the joint 17 by the urging force of the spring 15, the leading end part 12*a* of the rod 12 and the joint 17 move together rightward in FIGS. 1 and 4, rotating the rotary block 9 in the counterclockwise direction about the supporting shaft 8 and moving the rotary block 9 from the incline position Y1 to the horizontal position Y2. Thereafter, the rotary block 9 is positioned at the horizontal position Y2 through contact with the upper stopper 18 by the urging force of the spring 15, and then, the rotary block is kept in a state of the horizontal position by the urging force of the spring 15. Immediately after the rotary block 9 starts moving from the incline position Y1 to the horizontal position Y2, in the driving mechanism 25 for the second stopper 9*c*, the lever 28 separates from the lever stopper 31*a* and is rotated by the urging force of the spring 26 to raise the stopper main body 29. As a result, the second stopper 9*c* projects up from in the groove 9*a* of the rotary block 9 to prevent the component 2-1 in the groove 9*a* of the rotary block 9 from slipping off. When the rotary block 9 starts moving from the incline position Y1 to the horizontal position Y2 to release the depression of the rotary block 9 to the rotary block contact part 21*b* of the component movement-regulating device 20, the movement regulation pin 21*c* of the component movement-regulating device 20 projects up from in the groove 4*a* at the lowest end of the groove 4*a* of the inclined chute 4, thus regulating the component 2-2 which will slide next to the lowest end so that it will not drop out from the inclined chute 4.

The air cylinder 10 is continuously driven after the rotary block 9 is positioned at the horizontal position Y2 in contact with the upper stopper 18. As a result, when the rod 12 approaches the front position A1, the spring receiver 16 secured to the rod 12 moves the projection 5*e* at the lowest end of the lever 5*a* to the right, whereby the lever 5*a* is forcibly rotated in the counterclockwise direction from the engagement position K1 to the engagement release position K2 against the urging force of the spring 26. Then, the component 2-2 second from the lowest end which has been engaged by the engagement part 5*c* is freed and slides to the lowest end of the inclined chute 4, where the component is regulated in movement by the movement regulation pin 21*c* at the lowest end of the inclined chute 4. The component 2-2 thus placed at the lowest end position of the inclined chute 4 will be received from the inclined chute 4 to the rotary block 9 when the rotary block next comes to the incline position Y1.

In the meantime, while the rod 12 continuously moves forward to the front position A1, the leading end part 12*a* of the rod 12 separates from the joint 17 and touches the lever 13. The lever 13 is rotated by the leading end part 12*a* about the axis of the shaft 14, and the shutter 11 staying at the pop-out prevention position in the groove 9*a* of the rotary block 9 positioned at the horizontal position Y2 moves to the retreat position. As a result of this, the component 2-1 in the groove 9*a* of the rotary block 9 at the horizontal position Y2 is sucked and held for removal, for example, by a component suction nozzle 62 of a component mounting apparatus of FIG. 18 which also has the component feeding apparatus 60.

Figure 18:
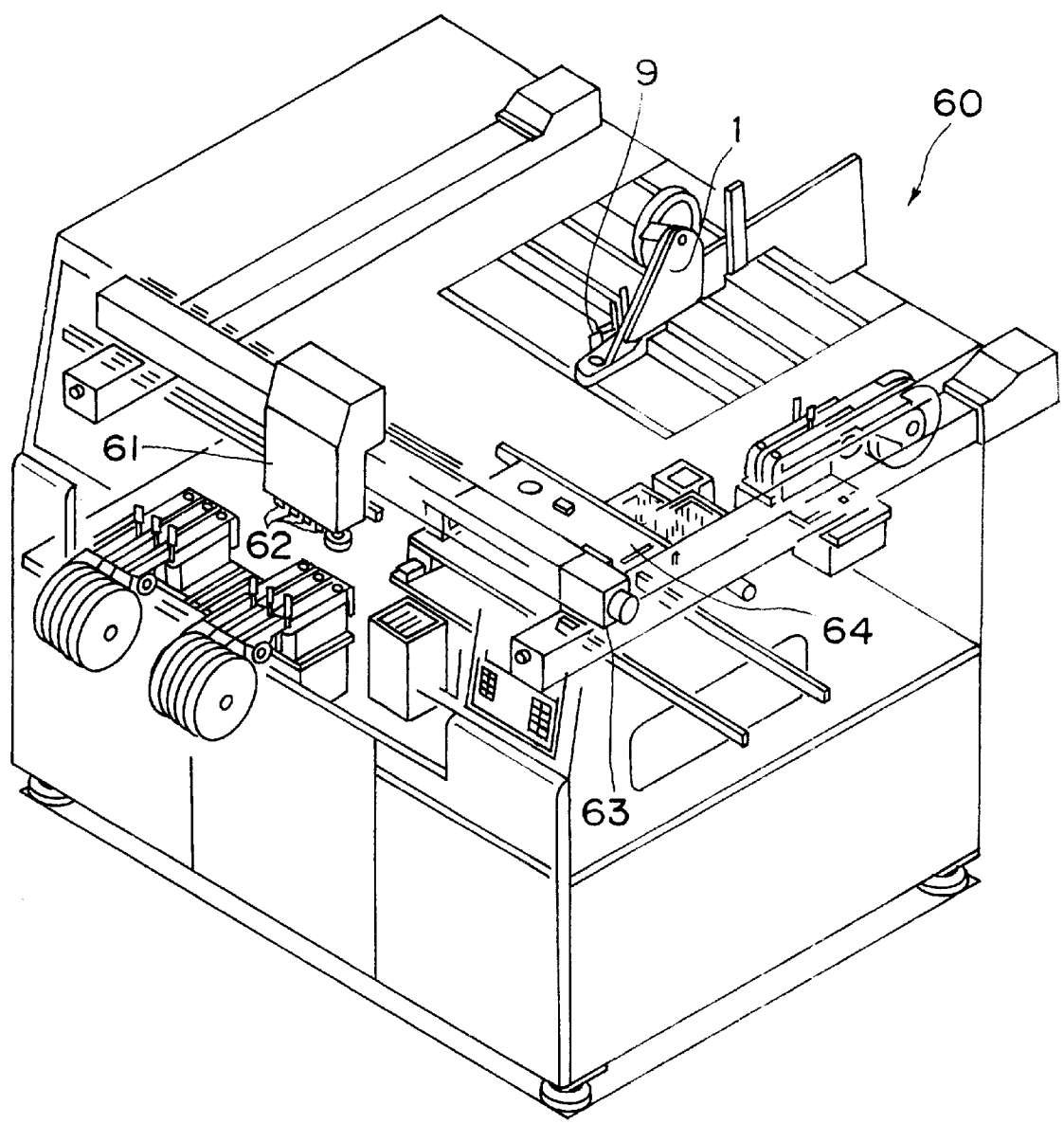
FIG. 18 is a total view of a component mounting apparatus of an XY robot type loading the component feeding apparatus of the embodiment.

More specifically, the component 2-1 in the component feeding apparatus 60 is sucked and held, for instance, by the nozzle 62 of a head part 61 of an XY robot type component mounting apparatus as shown in FIG. 18, and the head part 61 is moved to over a printed board 64 by an XY robot 63 set for moving the head part 61, so that the component 2-1 sucked and held by the nozzle 62 is mounted onto the printed board 64.

Figure 19:
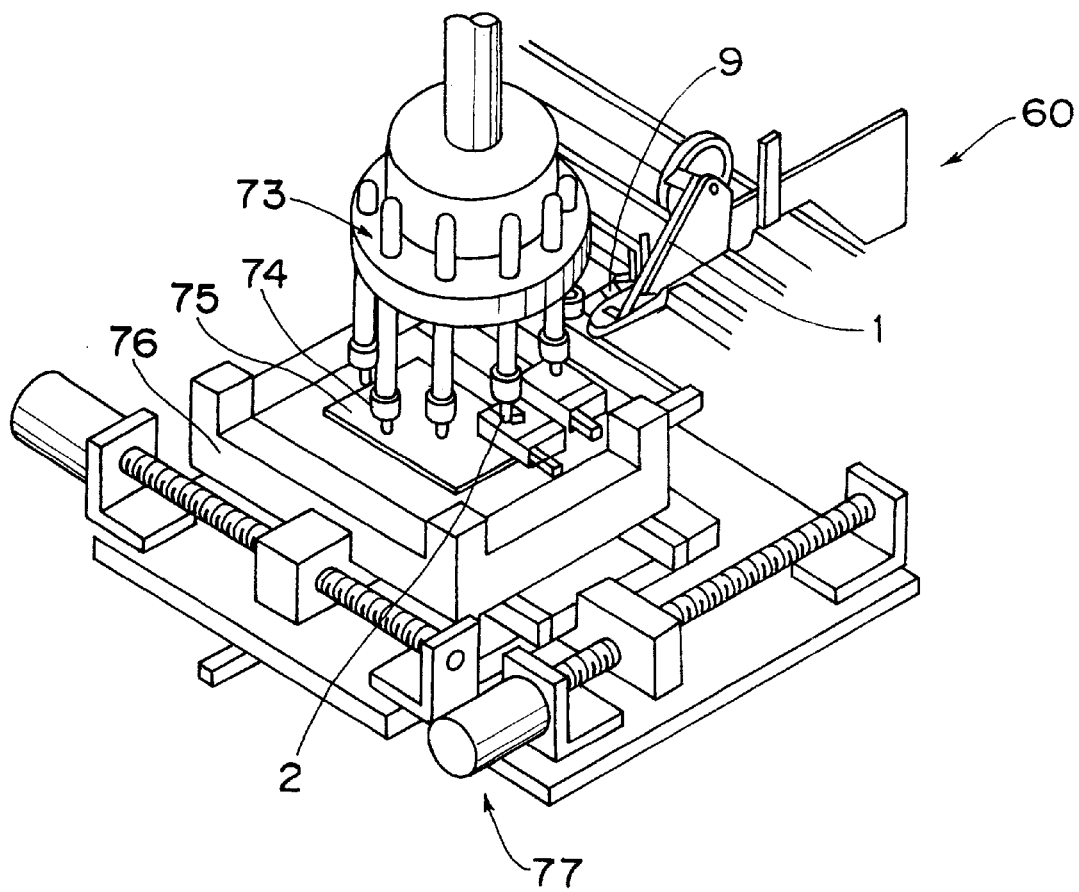
FIG. 19 is a total view of a rotary head type component mounting apparatus loading the component feeding apparatus of the embodiment.

Alternatively, the component 2-1 is sucked and held by a nozzle 74 of a rotary head 73 of a rotary head type component mounting apparatus as shown in FIG. 19. Through the rotation of the rotary head 73, the nozzle 74 moves to over a printed board 75 positioned on a board-positioning stage 76 by a board-positioning device 77, and the component 2-1 sucked and held by the nozzle 74 is mounted to the printed board 75.

After the component 2-1 in the groove 9a of the rotary block 9 at the horizontal position Y2 of the component feeding apparatus 60 is taken out by the nozzle 62 or 74, the air cylinder 10 drives oppositely to the above to start to move the rod 12 from the front position A1 to the back position A2.

Immediately after the rod 12 starts driving from the front position A1 to the back position A2, the rotary block 9 is kept positioned at the horizontal position Y2 because of the urging force of the spring 15. However, when the leading end part 12a of the rod 12 separates from the lever 13, the lever 13 is rotated about the axis of the shaft 14 by the urging force of the spring 33, whereby the shutter 11 located at the retreat position moves to the pop-out prevention position in the groove 9a of the rotary block 9 positioned at the horizontal position Y2.

Then, when the rod 12 moves toward the back position A2, the rear end face 12b of the leading end part 12a of the rod 12 comes into contact with the front end face 17b of the joint 17, compressing the spring 15 and moving the joint 17 forcibly in the left direction in FIG. 1. The rotary block 9 is accordingly rotated in the clockwise direction about the supporting shaft 8 to come into contact with the stopper 31b, thereby being positioned to at incline position Y1. At this time, the projection 5e at the lowest end of the lever 5a is freed from the rightward movement by the spring receiver 16 fixed to the rod 12 during the movement of the rod 12 towards the back position A2. The lever 5a is urged to rotate in the clockwise direction to the engagement position K1 by the urging force of the spring 26 to come into contact with the stopper 5f. The lever 5a is hence positioned at the engagement position K1. In consequence, the engagement part 5c enters between the component 2-2 at the lowest end of the inclined chute 1 and the component 2 second from the lowest end, thereby stopping the component 2 second from the lowest end from sliding.

Immediately before the rotary block 9 reaches the incline position Y1, the lever 28 touches the lever stopper 31a at the driving mechanism 25 for the second stopper 9c, whereby the stopper main body 29 is descended to let the second stopper 9c come out of the groove 9a of the rotary block 9. The component 2 is thus not hindered from moving from inside the groove 4a of the inclined chute 4 into the groove 9a of the rotary block 9. Also immediately before the rotary block 9 reaches the incline position Y1, part of the rotary block 9 comes in contact with the rotary block contact part 21b to forcibly rotate the lever 21 in the clockwise direction about the supporting shaft 22 against the urging force of the spring 24. As a result, the movement regulation pin 21c comes out of the groove 4a of the inclined chute 4, so that the component 2-2 at the lowest end in the groove 4a of the inclined chute 4 slides out from the groove 4a and moves by its own weight into the groove 9a of the rotary block 9 at the incline position Y1.

When the rotary block 9 is present at the incline position Y1, the operation of moving the rotary block to the horizontal position Y2 after receiving one component 2 from the inclined chute 4 and taking out the component 2 at the horizontal position Y2 by the nozzle of the component mounting apparatus is repeatedly carried out as needed. The components 2, . . . , 2 in the inclined chute 4 are sequentially supplied to the nozzle in this manner.

In the above-described embodiment, while the component 2 after having been supplied from the lowest end position of the inclined chute 4 and received and held by the rotary block 9 is held in the groove 9a of the rotary block 9 by the shutter 11 to not pop out of the groove 9a of the rotary block 9 and held by the first and second stoppers 9b, 9c to not deviate in position, the rotary block 9 is moved by the urging force of the. spring 15 constituting the single driving device from the incline position (i.e., component hold position) Y1 in FIG. 4 inclined along the inclined chute 4 to the horizontal position (i.e., component feed position ) Y2 of FIG. 5 where the component 2 is placed in the lateral direction for component supply. After the rotary block 9 is positioned at the horizontal position Y2, the shutter 11 is moved from the component pop-out prevention position to the retreat position by the driving force of the air cylinder 10 constituting the single driving device to free the pop-out prevention. The urging force of the spring 15 is deregulated by driving the air cylinder 10 and moving the rod 12 from the back position A2 towards the front position, thereby enabling both the rotational operation of the rotary block 9 by the urging force of the spring 15 between the incline position and the horizontal position, and the release of the component pop-out prevention operation by the shutter 11 from the component pop-out prevention position to the retreat position by the direct transmission of the driving force through the movement of the rod 12 from the front position A1 to the back position A2. Since the need of respectively setting the driving device for each operation is eliminated, the structure can be simplified. The driving device can be arranged for each component feeding apparatus, not using a common driving source with the other component feeding apparatuses, whereby the availability is improved.

Figure 11:
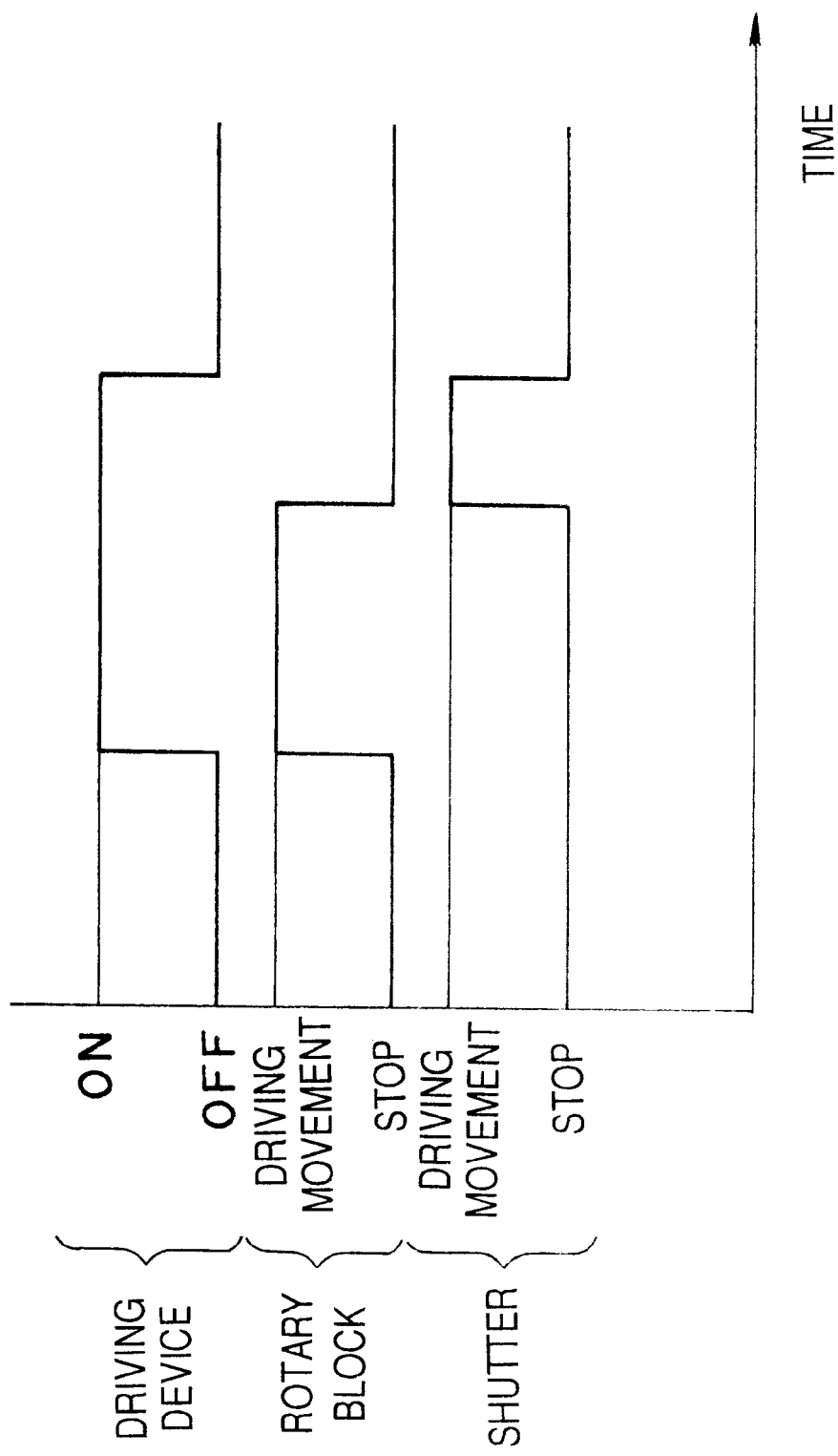
FIG. 11 is an operation timing chart of the component feeding apparatus.
Figure 12:
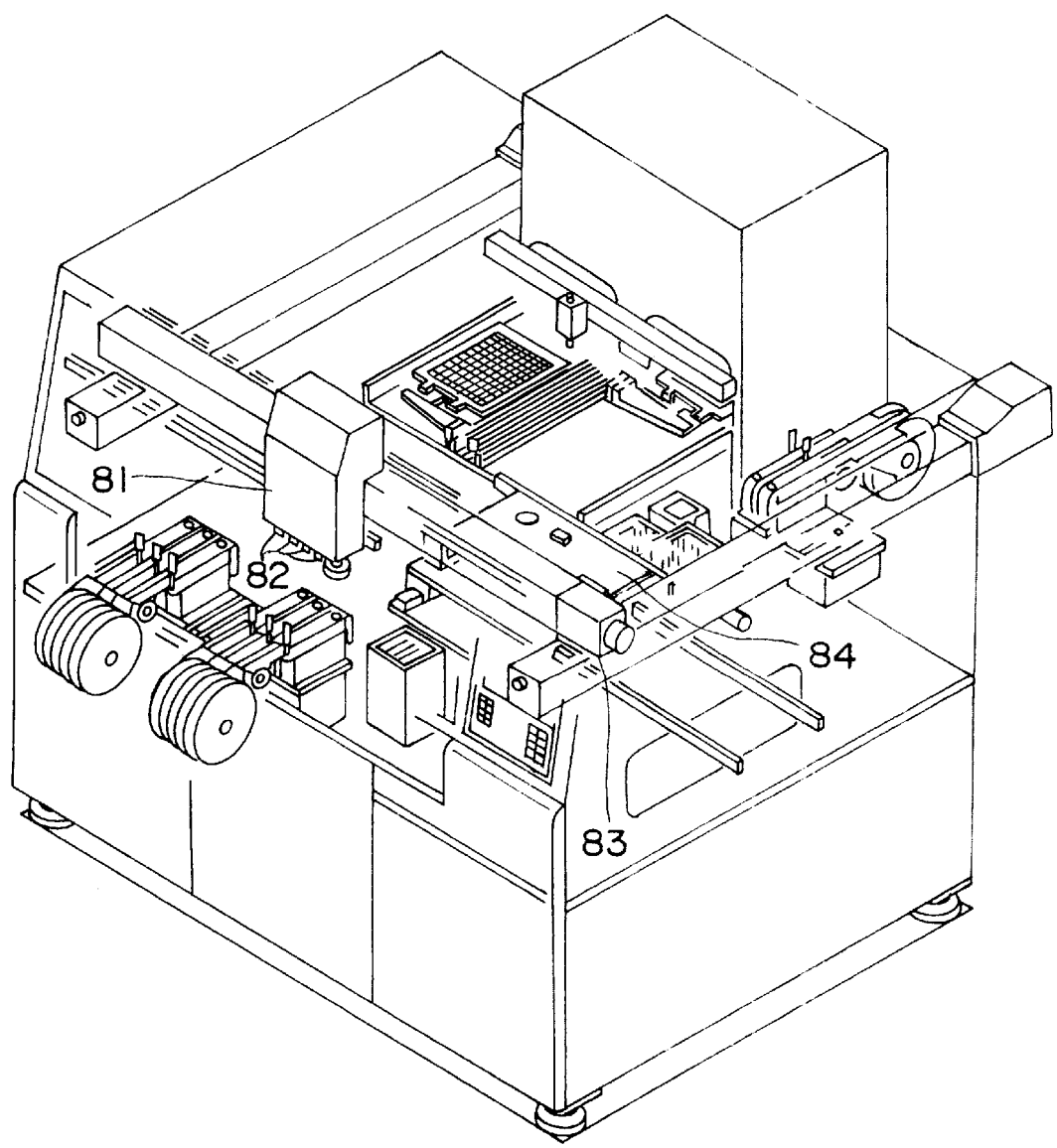
FIG. 12 is a total view of a conventional component mounting apparatus.
Figure 13:
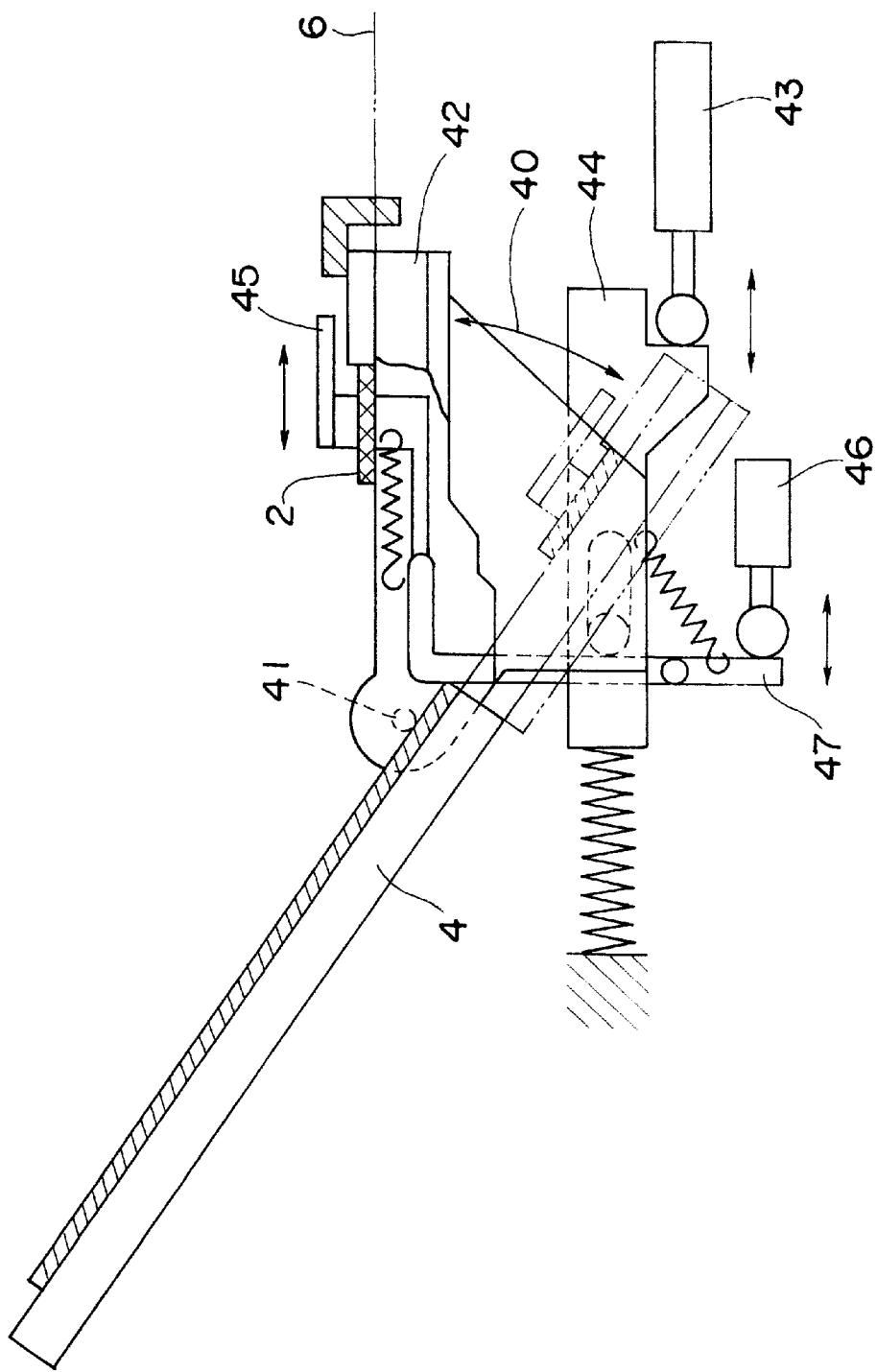
FIG. 13 is a side view of a conventional rotary device.
Figure 14:
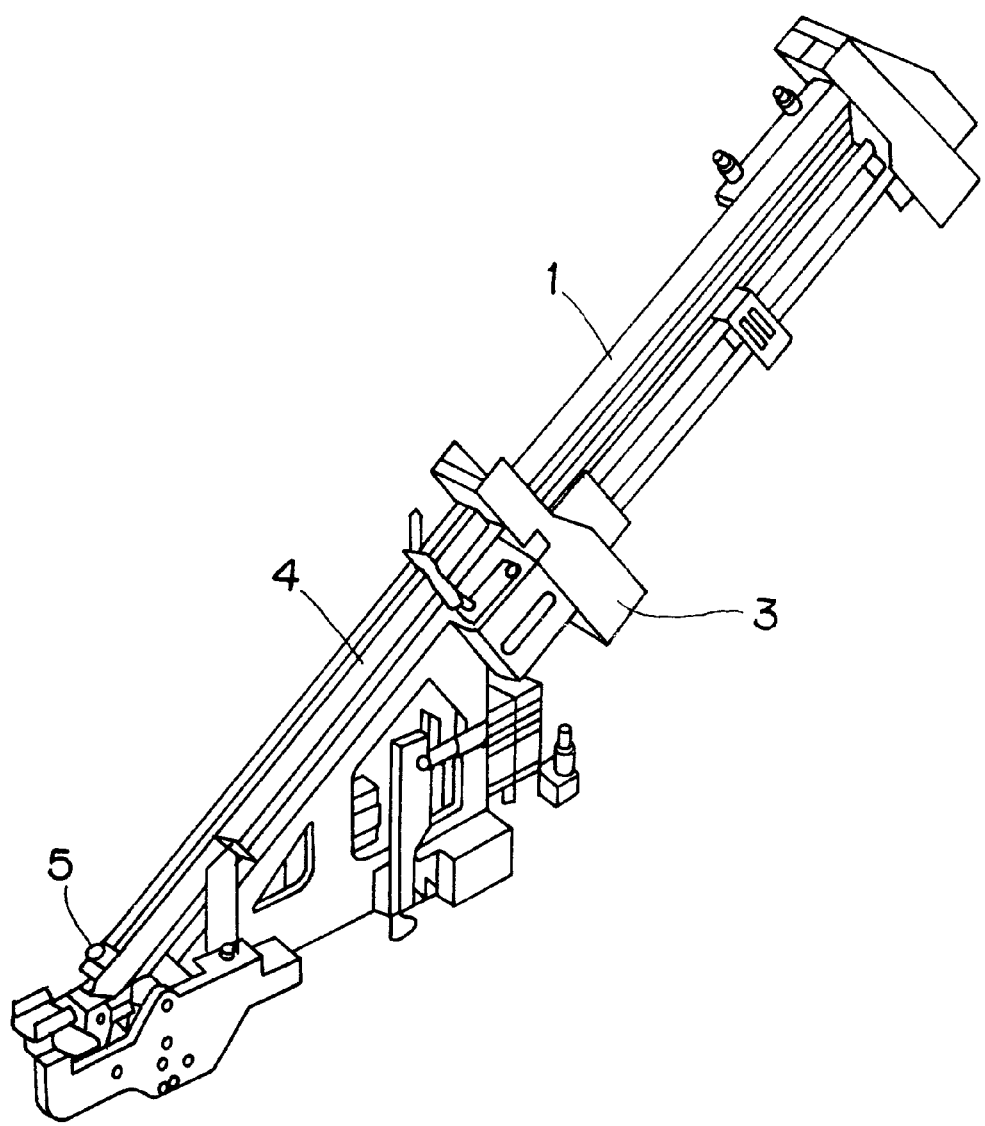
FIG. 14 is a total view of a conventional component feeding apparatus.
Figure 15:
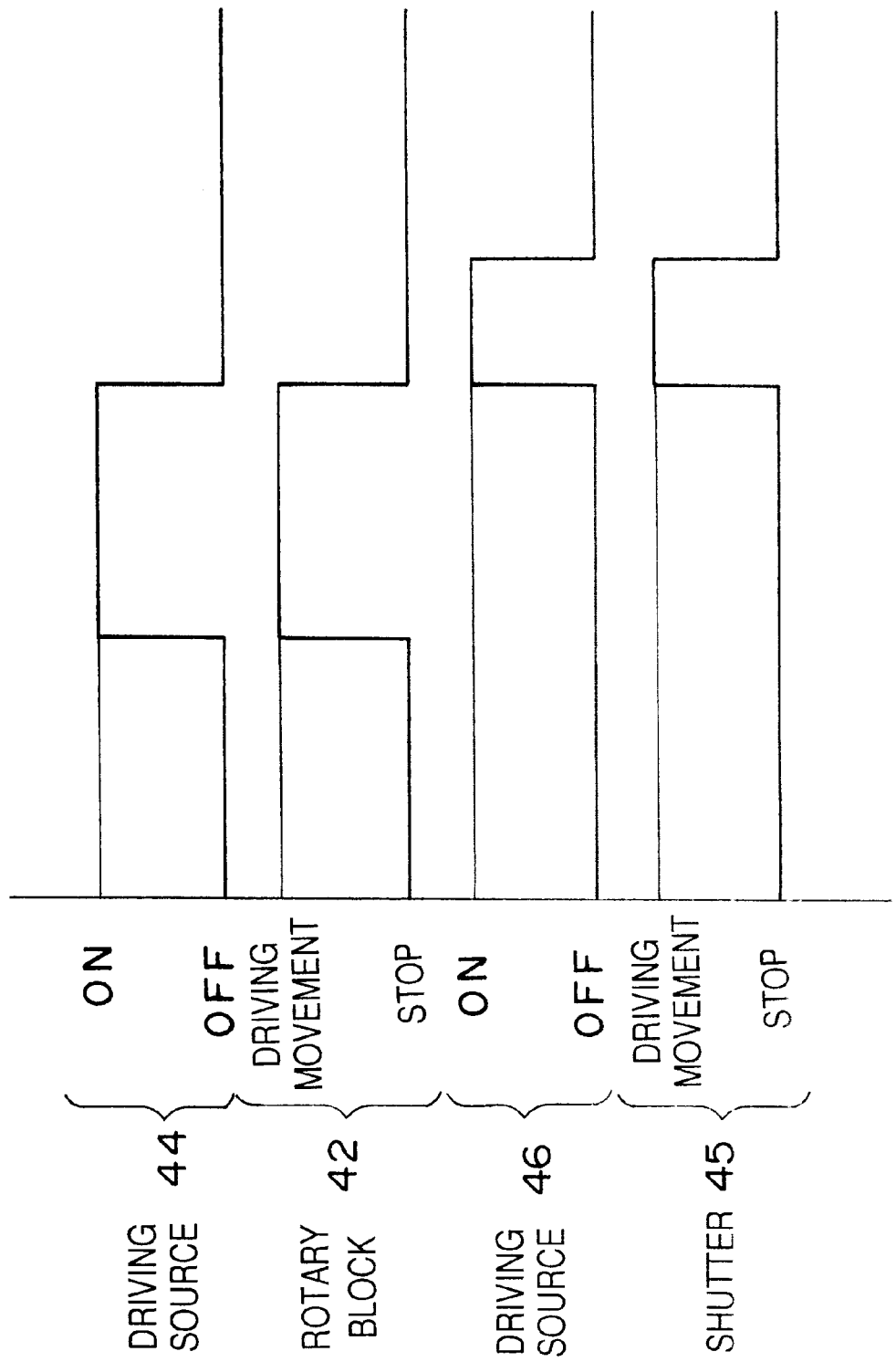
FIG. 15 is an operation timing chart of FIG. 14.
Figure 1:
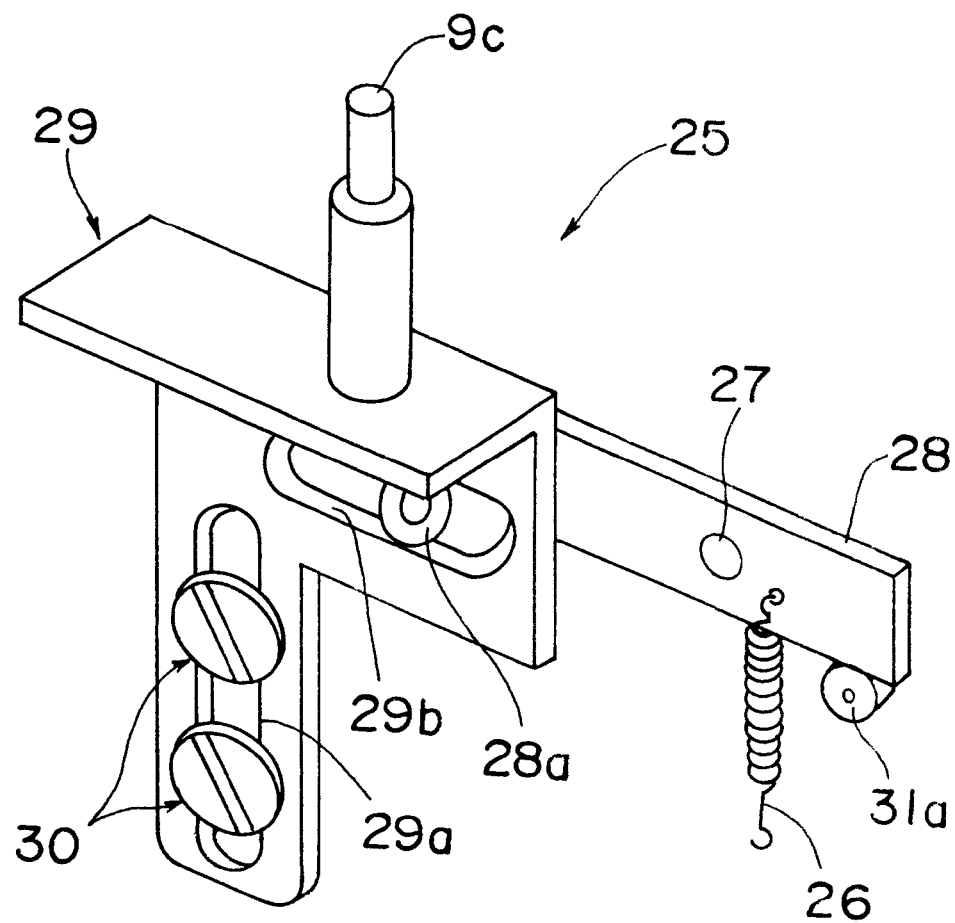

As shown in FIG. 11, during the advance of the rod 12 through driving of the air cylinder 10, first, in an initial period, the rotary block 9 is moved by the urging force of the spring 15 from the incline position Y1 to the horizontal position Y2. After the rotary block 9 touches the upper stopper 18 and surely reaches the horizontal position Y2, the shutter 11 is driven to move from the popout prevention position to the retreat position. The component 2-1 held by the rotary block 9 and moved from the incline position Y1 to the horizontal position Y2 is freed from the pop-out prevention after the rotary block 9 finishes the operation, and therefore can be surely prevented from accidentally popping outside from the groove 9a due to vibrations generated when the rotary block 9 reaches the horizontal position Y2.

The rotary block 9 is positioned at the horizontal position Y2 through contact with the upper stopper 18 by the spring 15. An extra load can be absorbed by the spring 15 and thus, a positioning accuracy at the horizontal position Y2 is further enhanced. On the contrary, for instance, if the rotary block 9 is positioned at the horizontal position Y2 through contact with the upper stopper 18 by means of the direct transmission of the driving force of the air cylinder, it is difficult to stop the driving force of the air cylinder after bringing the rotary block 9 into contact with the upper stopper 18, such that an overload could easily act against the rotary block 9 or the upper stopper 18. The positioning accuracy is hard to increase.

The forward and backward movement of the rod 12 of the air cylinder 10 and the regulation and deregulation to the urging force of the spring 15 serve for separating only the leading component 2-1 in the inclined chute 4 from the other component 2-2, regulating the other component 2-2 to not move in the inclined chute 4 when only the leading component 2-1 is moved from the inclined chute 4 to the rotary block 9, preventing the component 2 from dropping out of the inclined chute 4 when the rotary block 9 moves from the incline position Y1 to the horizontal position Y2, and movement-regulating and preventing the component 2-1 held by the rotary block 9 from popping outside while the rotary block 9 moves from the incline position Y1 to the horizontal position Y2. Various operations can be carried out with an appropriate timing by the driving device of a simple structure. The whole of the component feeding apparatus is simplified in structure.

The present invention is not limited to the above embodiment and can be carried out in other various forms. For example, the apparatus is particularly appropriate for supplying electronic components among components although it is described in the foregoing description to supply general components. More specifically, a concrete example of the component 2 is an IC, a connector, or the like.

According to the component feeding apparatus and method of the present invention, once one component supplied from the lowest end position of the inclined chute is received and held by the rotary member, while the component held by the rotary member is prevented by the component pop-out preventing device from popping outside, the rotary member is moved by the driving force of a single driving device from the component hold position inclined along the inclined chute to the component feed position where the component is to be supplied. After the rotary member is positioned at the component feed position, the pop-out prevention is released by the pop-out preventing device by the driving force of the single driving device. The driving force of the single driving device achieves both the rotational operation of the rotary member between the incline position and the horizontal position, and the releasing operation of the pop-out prevention operation of the pop-out preventing device. Accordingly, the need of separately setting the driving device for each operation is eliminated and the structure can be simplified. Since the driving device can be arranged for each component feeding apparatus without using a common driving source with the other component feeding apparatuses, the availability can be improved.

More specifically, after one component supplied from the lowest end position of the inclined chute is received and held by the rotary member, while the component held in the groove of the rotary member is kept by the shutter from popping out of the groove of the rotary member (or while the component held in the groove of the rotary member is prevented by the shutter from popping outside and moreover held by the first and second stoppers to not shift in position), the rotary member is moved by the urging force of the spring constituting the single driving device from the component hold position inclined along the inclined chute to the component feed position for the supply of the component. Moreover, after the rotary member is positioned at the component feed position, the shutter is moved by the driving force of the air cylinder constituting the single driving device from the pop-out prevention position to the retreat position to release the pop-out prevention. When the regulation to the urging force of the spring is freed by driving the air cylinder to move the rod from the back position to the front position, the rotational operation of the rotary member by the urging force of the spring between the incline position and the horizontal position, and the pop-out prevention release operation for the shutter from the pop-out prevention position to the retreat position by directly transmitting the driving force through the movement of the rod between the front position and the back position can be both achieved. It is not necessary to respectively set the driving device for each operation, thereby simplifying the structure. Moreover, the driving device can be set for every component feeding apparatus without using a common driving source shared with the other component feeding apparatuses, and is thus improved in availability.

During the advance of the rod by the driving of the air cylinder, in the first period, the rotary member is moved by the urging force of the spring from the component hold position to the component feed position. After the rotary member surely reaches the component feed position, the shutter is driven to move from the pop-out prevention position to the retreat position. Since the component held by the rotary member and moved from the component hold position to the component feed position is freed from the pop-out prevention after the rotary member completes the operation, the component can be surely prevented from unexpectedly popping outside from the groove due to vibrations generated when the rotary member reaches the component feed position.

The rotary member is positioned at the component feed position by the spring and therefore the spring can absorb an extra load. The positioning accuracy at the component feed position can be further enhanced. To the contrary, for example, if a rotary member is brought in contact with a stopper thereby being positioned at a component feed position by directly transmitting a driving force of an air cylinder, it is difficult to stop the driving force of the air cylinder after the rotary member comes in contact with the stopper. An overload tends to act on the rotary member or the stopper. Enhancement in positioning accuracy is obstructed.

The separation of only the leading component in the inclined chute from the other component, the movement regulation to the other component in the inclined chute when only the leading component is moved from the inclined chute to the rotary member, the dropping prevention for preventing the component from dropping from the inclined chute when the rotary member moves from the component hold position to the component feed position, and the movement regulation and pop-out prevention of the component held by the rotary member when the rotary member moves from the component hold position to the component feed position are executed by the forward and rearward movement of the rod of the air cylinder and the regulation and deregulation to the urging force of the spring. Various operations can be conducted with a proper timing by the driving device of the simple structure. The component feeding apparatus can be simplified in structure as a whole.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component feeding apparatus for feeding components to a predetermined position, which comprises:
   a holder for holding a stick capable of storing the components;
   an inclined chute set with an inclination so that the components can slide in an array from the stick;

a separating device for separating only a leading component in the inclined chute from the other components;

a rotary device including a rotary member for holding the leading component separated by the separating device, which moves the rotary member from a component hold position inclined along the inclined chute where the leading component separated by the separating device is held by the rotary member to a component feed position where the component is placed in a position for component supply;

a component pop-out preventing device for preventing the leading component held by the rotary member from popping outside for a period after the leading component separated by the separating device is held at the component hold position by the rotary member before the rotary member reaches the component feed position, and for releasing the leading component held by the rotary member after the rotary member reaches the component feed position; and a single driving device for moving the rotary member of the rotary device between the component hold position and the component feed position and causing the component pop-out preventing device to release the leading component at the component feed position of the rotary member.

2. A component feeding apparatus according to claim 1, wherein the driving device linearly moves a rod between a front position and a back position, so that at the back position of the rod, the rotary member is positioned at the component hold position and the leading component held by the rotary member is prevented from popping outside by the component pop-out preventing device, while at the front position of the rod, the rotary member is positioned at the component feed position, then the leading component held by the rotary member is released by the component pop-out preventing device.

3. A component feeding apparatus according to claim 1, wherein the driving device comprises:

an air cylinder for linearly moving a rod between a front position and a back position; and an urging member for urging the rotary member to rotate to the component feed position, having an urging force regulated at the back position of the rod, whereby the rotary member is positioned at the component hold position at the back position of the rod, and the rotary member is urged to rotate to the component feed position by the urging force of the urging member through deregulation of the urging force of the urging member when the rod moves from the back position to the front position, and a driving force from the rod is transmitted when the rod reaches the front position after the rotary member is urged to rotate to the component feed position, thereby causing the component pop-out preventing device to release the leading component held by the rotary member.

4. A component feeding apparatus according to claim 1, wherein the component pop-out preventing device comprises:

a shutter set openably relative to the rotary member for movement between a component pop-out prevention position for preventing the leading component from popping outside and a retreat position for releasing the leading component;

a shaft coupled to the shutter;

a lever coupled to the shutter via the shaft and which comes in contact with a rod of the driving device when the rod linearly moves thereby rotating the shutter from the component pop-out prevention position to the retreat position; and an urging member for always urging the shutter to rotate from the retreat position to the component pop-out prevention position.

5. A component feeding apparatus according to claim 1, wherein the rotary member is supported rotatably about a fulcrum, so that the rotary member is positioned at the component hold position when a rod of the driving device linearly moves and reaches a back position, and positioned at the component feed position when the rod reaches a front position.

6. A component feeding apparatus according to claim 1, wherein the rotary member has a groove for receiving the leading component from the inclined chute at the component hold position, a first stopper for regulating a leading end side of the leading component received in the groove to not move, and a second stopper which comes out of the groove at the component hold position, projects into the groove while the rotary member is moving from the component hold position to the component feed position immediately after the rotary member starts moving from the component hold position to the component feed position and at the component feed position, thereby regulating a rear end side of the leading component received in the groove to not move.

7. A component feeding apparatus according to claim 1, wherein the separating device comprises:

an engagement part for entering between the leading component and a second component adjacent to the leading component in the inclined chute, thereby regulating the second component to not move;

a lever for inserting the engagement part between the leading component and the second component in the inclined chute; and an urging member for driving the lever when a rod of the driving device linearly moves and reaches a back position, thereby inserting the engagement part between the leading component and the second component in the inclined chute to regulate the component to not move, so adapted that when the rod linearly moves to reach a front position, the lever is driven oppositely through the linear movement of the rod of the driving device, thereby releasing the movement regulation of the second component by the engagement part.

8. A component feeding apparatus according to claim 1, wherein the inclined chute has a movement regulation member for regulating the leading component in the inclined chute to not drop from the inclined chute when the rotary member is present at a position other than the component hold position, so that the movement regulation of the leading component in the inclined chute by the movement regulation member is released by the rotary member when the rotary member is present at the component hold position, thereby enabling the leading component to be received from the inclined chute by the rotary member.

9. A component mounting apparatus, whereby a component supplied from the component feeding apparatus according to claim 1 is, after being held by a component hold member, mounted to a predetermined position of a circuit formation body.

10. A component feed method for feeding components to a predetermined position, which comprises:

separating only a leading component from the other components in an inclined chute set with an inclination so that the components can slide in an array from a stick capable of storing the components;

holding the separated leading component at a rotary member present at a component hold position inclined along the inclined chute;

transmitting a driving force from a single driving device to a rotary device and a component pop-out preventing device, thereby holding the leading component at the rotary member present at the component hold position, then moving the rotary member by the rotary device to a component feed position where the component is placed in a position for component supply, and moreover causing the component pop-out preventing device to prevent the leading component held by the rotary member from popping outside after the leading component is held at the component hold position before the rotary member reaches the component feed position, and releasing the leading component held by the rotary member after the rotary member reaches the component feed position.

11. A component feed method according to claim 10, wherein the single driving device linearly moves a rod between a front position and a back position, so that at the back position of the rod, the rotary member is positioned at the component hold position and the leading component held by the rotary member is prevented from popping outside by the component pop-out preventing device, while at the front position of the rod, the leading component held by the rotary member is released by the component pop-out preventing device after the rotary member is positioned at the component feed position.

12. A component feed method according to claim 10, wherein the driving device includes an air cylinder for linearly moving a rod between a front position and a back position, and an urging member for urging to rotate the rotary member to rotate to the component feed position, having the urging force regulated at the back position of the rod, so that the rotary member is positioned at the component hold position at the back position of the rod, and the rotary member is urged to rotate to the component feed position by the urging force of the urging member through deregulation of the urging force of the urging member when the rod moves from the back position to the front position, and a driving force from the rod is transmitted when the rod reaches the front position after the rotary member is urged to rotate to the component feed position, thereby causing the component pop-out preventing device to release to the leading component held by the rotary member.

13. A component feed method according to claim 10, wherein the component pop-out preventing device prevents the leading component from popping outside when a shutter openably set relative to the rotary member reaches a component pop-out prevention position, and releases the leading component when the shutter reaches a retreat position, so adapted that a driving force from a rod of the driving device is transmitted when the rod linearly moves, thereby rotating the shutter from the component pop-out prevention position to the retreat position, while the shutter is always urged by the urging member to rotate from the retreat position to the component pop-out prevention position.

14. A component feed method according to claim 10, wherein the rotary member rotates about a fulcrum thereby being positioned at the component hold position when a rod of the driving device linearly moves and reaches a back position, and moreover the rotary member rotates about the fulcrum thereby being positioned at the component feed position when the rod reaches a front position.

15. A component feed method according to claim 10, which further comprises:

receiving the leading component into a groove of the rotary member from the inclined chute at the component hold position when the separated leading component is to be held by the rotary member;

regulating a leading end side of the leading component received in the groove to not move, by use of a first stopper; and regulating a rear end side of the leading component received in the groove to not move by use of a second stopper which projects into the groove while the rotary member is moving from the component hold position to the component feed position immediately after the rotary member starts moving from the component hold position towards the component feed position and at the component feed position.

16. A component feed method according to claim 10, which also comprises:

inserting an engagement part between the leading component and a second component adjacent to the leading component in the inclined chute when only the leading component in the inclined chute is to be separated from the other components, thereby regulating the second component to not move;

when a rod of the driving device linearly moves and reaches a front position, driving a lever oppositely through linear movement of the rod, thereby releasing the movement regulation of the second component by the engagement part.

17. A component feed method according to claim 10, which comprises, in the inclined chute, regulating the leading component in the inclined chute by a movement regulation member to not drop out of the inclined chute when the rotary member is positioned at a position other than the component hold position, while releasing, by the rotary member, the movement regulation of the leading component in the inclined chute by the movement regulation member when the rotary member is present at the component hold position, thus, enabling the leading component to be received from the inclined chute by the rotary member.

* * * * *